United States Patent [19]

Kamisaki

[11] Patent Number: 5,528,552
[45] Date of Patent: Jun. 18, 1996

[54] DYNAMIC RANDOM ACCESS MEMORY DEVICE WITH SENSE AMPLIFIERS SERVING AS CACHE MEMORY INDEPENDENT OF ROW ADDRESS BUFFER UNIT FOR HIGH-SPEED SEQUENTIAL ACCESS

[75] Inventor: Sachiko Kamisaki, Tokyo, Japan

[73] Assignee: NEC Corporation, Tokyo, Japan

[21] Appl. No.: 292,005

[22] Filed: Aug. 17, 1994

[30] Foreign Application Priority Data

Aug. 18, 1993 [JP] Japan ................................. 5-225185

[51] Int. Cl.[6] .................................................. G11C 8/00
[52] U.S. Cl. .................... 365/238.5; 365/230.03
[58] Field of Search .......................... 365/238.5, 230.03, 365/233, 230.08

[56] References Cited

U.S. PATENT DOCUMENTS 4,480,320  10/1984  Naiff ..................................... 365/238.5
4,802,135  1/1989  Shinoda .............................. 365/238.5
4,907,203  3/1990  Wada .................................. 365/238.5
5,367,495  11/1994  Ishikawa ............................ 365/238.5

OTHER PUBLICATIONS

"Full Portrait of 4.5M Rambus DRAM–Realize 500 M–byte/second Date Transmission Speed through 72–bit Row Function", Kushiyama and Furyama, Aug. 1992, pp. 75–80.

Primary Examiner—A. Zarabian
Attorney, Agent, or Firm—Sughrue, Mion, Zinn, Macpeak & Seas

[57] ABSTRACT

A dynamic random access memory device causes sense amplifier circuits to serve as a cache memory for sequentially delivering data bits in the sense amplifier circuits, and a row address buffer unit is controlled independently of the sense amplifier circuits so as to change the row address signal without canceling the data bits in the sense amplifier circuits.

10 Claims, 16 Drawing Sheets

DYNAMIC RANDOM ACCESS MEMORY DEVICE WITH SENSE AMPLIFIERS SERVING AS CACHE MEMORY INDEPENDENT OF ROW ADDRESS BUFFER UNIT FOR HIGH-SPEED SEQUENTIAL ACCESS

FIELD OF THE INVENTION

This invention relates to a dynamic random access memory device and, more particularly, to a dynamic random access memory device having sense amplifiers serving as a cache memory for high speed sequential access such as, for example, a page mode access.

DESCRIPTION OF THE RELATED ART

A typical example of the dynamic random access memory device is illustrated in FIG. 1 of the drawings, and comprises an array of latch circuits 100 to 10n, an array of AND gates 110 to 11n, a row address decoder unit 12 for selectively driving word lines 13, a memory cell array 14 associated with a plurality of bit line pairs 15 and a sense amplifier unit 16 for developing potential differences on the bit line pairs 15. Though not shown in the drawings, a plurality of dynamic random access memory cells are incorporated in the memory cell arrays, and the word lines 13 and the bit line pairs 15 are selectively coupled to the plurality of dynamic random access memory cells.

The prior art dynamic random access further comprises a column address buffer circuit 17, a column address decoder unit 18 coupled to the column address buffer circuit 17, a column selector unit 19 for selectively coupling the plurality of bit line pairs 15 to a data bus 20 under the control of the column address decoder unit 18 and an input/output circuit 21 coupled between the data bus 20 and an input/output data pin 22, and a write-in data bit and a read-out data bit are transferred from and to the input/output data pin 22.

The prior art dynamic random access memory device further comprises a timing controller 23 for producing various internal timing signals in response to external control signals. A row address strobe signal RAS and a column address strobe signal are two of those external control signals, and a row address latch signal RL and a column address latch signal CL are produced from the row address strobe signal RAS and the column address strobe signal CAS.

The prior art dynamic random access memory device thus arranged behaves in a data access mode as follows. An row address signal indicative of a row address is supplied to address pins ADD0 to ADDn, and is to stored in the latch circuits 100 to 10n in response to the row address latch signal RL. The AND gates 110 to 11n are enabled with the row address latch signal RL, and transfers the internal row address bits X0 to Xn to the row address decoder unit 12.

The row address decoder unit 12 is responsive to the internal row address bits X0 to Xn, and energizes one of the word lines 13. The dynamic random access memory cells coupled to the energized word line 13 are electrically connected to the bit line pairs I 5, and data bits stored therein are transferred to the bit line pairs 15. The data bits form potential differences on the bit line pairs 15, and the potential differences are developed by the sense amplifier unit 16.

The address signal indicative of a column address is supplied to the address pins ADD0 to ADDn, and are latched by the column address buffer circuit 17 in response to the column address latch signal CL. The column address buffer circuit 17 produces internal column address bits Y0 to Yn from the address signal, and are supplied to the column address decoder unit 18. The column address decoder unit 18 causes the column selector unit 19 to couple one of the bit line pairs 15 with the column address to the data bus 20, and the potential difference on the selected bit line pair is transferred through the data bus 20 to the input/output circuit 21. The input/output circuit produces an output data signal from the potential difference, and supplies the output data signal to the input/output data pin 22.

When another data bit is accessed, the external device specifies the row address and the column address assigned to the dynamic random access memory cell storing the data bit, and the prior art dynamic random access memory device repeats the above described read-out sequence.

In order to improve a data access speed, various attempts have been made, and one of the approaches is known as a page access mode.

FIG. 2 illustrates the page access mode. In the page access mode, the address signal indicative of a row address is supplied to the address pins ADD0 to ADDn, and the row address strobe signal RAS is changed to an active low level at time t1. The timing controller 23 changes the row address latch signal RL to an active high level at time t2, and supplies the row address latch signal RL to the latch circuits 100 to 10n. Then, the address signal is stored in the latch circuits 100 to 10n.

The internal row address bits X0 to Xn are produced from the address signal at time t3, and the row address decoder unit 12 is responsive to the internal row address bits X0 to Xn for energizing a word line assigned the row address at time t4. The internal row address bits X0 to Xn and the selected word line are maintained during a sequential read-out in the page access mode.

The data bits are transferred from the dynamic random access memory cells coupled to the selected word line to the bit line pairs 15 at time t5, and the sense amplifier unit 16 develops the potential differences indicative of the read-out data bits.

The address signal indicative of a first column address CA1 is supplied to the address pins ADD0 to ADDn, and the column address strobe signal CAS is changed to the low voltage level at time t6. The timing controller 23 produces the column address latch signal CL, and the address signal indicative of the first column address CA1 is latched by the column address buffer circuit 17. The column address decoder unit 18 decodes the internal column address bits Y0 to Yn, and causes the column selector 19 to couple the bit line pair assigned the first column address to the data bus 20. The potential difference is transferred from the bit line pair assigned the first column address CA1 through the data bus 20 to the input/output circuit 21, and the output data signal indicative of the first accessed data bit is delivered to the external device.

The address signal is changed to the second column address CA2 and, thereafter, to the third column address CA3, and the address signal is latched in synchronism with the column address strobe signal CAS at time t7 and t8. As a result, the column address decoder unit 18 causes the column selector unit 19 to sequentially couple the bit line pairs assigned the second column address CA2 and the third column address CA3 to the data bus 20, and the input/output circuit 21 sequentially changes the output data signal to the logic level of the second accessed data bit and the logic level of the third accessed data bit.

The row address strobe signal RAS is recovered to the inactive high voltage level at time t9, and the decay of the selected word line and the precharge on the bit line pairs 15 are carried out at time t10 and time t11.

The selected word line is boosted over the power voltage level for restoring the high voltage level on the bit lines into the selected dynamic random access memory cells without potential drop, and the potential level on the selected word line is liable to be decayed due to undesirable leakage. For this reason, the undesirable potential drop of the selected word line sets a limit on the RAS access time $t_{RAS}$ when the sequential data access in the page mode is allowed.

Thus, the selection of a word line is followed by sequential change of the column address, and the data bits are sequentially accessible from the dynamic random access memory cells coupled to the selected word line.

Another approach is to use sense amplifier circuits as a cache memory. FIG. 3 illustrates another dynamic random access memory device using sense amplifiers as a cache memory. The prior art dynamic random access memory device has four memory cell array/bank units 25a, 26a, 27a and 28a, four row address buffer units 25b, 26b, 27b and 28b for latching respective address signals ADD in response to row address latch signals RLA, RLB, RLC and RLD, four row address decoder units 25c, 26c, 27c and 28c responsive to the address signals for independently selecting rows of memory cells from the associated memory cell array/bank units 25a, 26a, 27a and 28a and four sense amplifier units 25d, 26d, 27d and 28d for storing the data bits after the differential amplification.

The address signals ADD are sequentially latched by the row address buffer units 25b, 26b, 26b and 27b in synchronism with the row address latch signals RLA, RLB, RLC and RLD. The address signals ADD may specify four different row addresses for the respective memory cell array/bank units 25a, 26a, 27a and 28a.

The four sets of internal row address bits XnA, XnB, XnC and XnD are decoded by the row address decoder units 25c to 28c, and four word lines are energized by the associated row address decoder units 25c to 28c. Four sets of data bits are read out from the four rows of memory cells to the associated four sets of bit line pairs, and are transferred to the four sense amplifier units 25d to 28d, respectively.

While the data bits read out from the selected rows are sequentially accessed, the data bits are transferred from the sense amplifier units 25d to 28d to an interface unit (not shown). The row address strobe signal RAS is maintained at the active low level in so far as an external device does not specify another row of memory cells, and the sequential access is similar to that of the page access mode. Thus, the data bits are accessible in CAS access time which is a third of the RAS access time $t_{RAS}$.

However, various problems are encountered in the prior art dynamic random access memory device shown in FIG. 3. First, the memory cell array/bank units 25a to 28a require the respective row address decoders 25c to 28c and the signal lines for the internal row address bits XnA to XnD, and these additional circuits and the signal lines enlarge the semiconductor chip. This is the first problem inherent in the prior art dynamic random access memory device shown in FIG. 3.

As described hereinbefore in connection to the page mode, the leakage from the selected word lines sets the limit on the RAS access time $t_{RAS}$, and the prior art dynamic random access memory device periodically restarts the word line selection even though the external device continuously accesses the data bits on the same word line. Therefore, the second problem is the frequent word line selection.

The third problem is a prolonged access time period when the row address is changed. In detail, assuming now that an external device needs to access a data bit on a different word line, the external device changes the row address strobe signal RAS to the inactive high voltage level at time t21 (see FIG. 4), and the selected word line is recovered to the low voltage level at time t22. Subsequently, the bit line pairs are precharged, and the bit lines of each pair are balanced at time t23. The time period between time t21 and time t22 is labeled with T1, and the time period between time t22 and time t23 is labeled with T2. When the precharging is completed, the row address strobe signal RAS is changed to the active low voltage level again, and the address signal ADD indicative of a new row address is latched by the row address buffer circuit. A new word line is energized at time t25, and new data bits are read out from the memory cells coupled to the new word line to the bit line pairs at time t26. After the sense amplification, the column address strobe signal CAS is changed to the active low voltage level for latching a new column address at time t27, and the output data signal indicative of the accessed data bit becomes valid at time t28.

Thus, the total time period for accessing the new data on the different word line is the sum of time period T1, the time period T2 and time period $T_{RAC}$ from the decay of the row address strobe signal RAS to the output of the output data signal. Thus, the data access speed is greatly slowed down if the row address is changed.

SUMMARY OF THE INVENTION

It is therefore a primary important object of the present invention to provide a dynamic random access which is integrated on a small semiconductor chip.

To accomplish the primary object, the present invention proposes to share a row address decoder unit between a plurality of memory cell arrays.

It is a secondary object of the present invention to provide a dynamic random access memory device which is improved in access time.

To accomplish the secondary object, the present invention proposes to reset word lines independently from sense amplifiers. As shown in FIG. 5, a word line of selected bank "A" is energized at the trailing edge TE1 of a row address strobe signal, and data bits are amplified by sense amplifiers. Word lines of non-selected bank "B" remain inactive, and sense amplifiers associated with the non-selected bank "B" continuously maintain data bits previously read out. Even if the selected word line of the bank "A" is discharged at the trailing edge TE2 of a restore control signal independent from the row address strobe signal, the bit line pairs are not balanced, and the data bits are sequentially read out from the sense amplifiers to the outside thereof in synchronism with changes of a column address strobe signal.

In accordance with the present invention, there is provided a dynamic random access memory device having a page mode, comprising: a) a plurality of memory cell arrays respectively assigned bank addresses, and each implemented by a plurality of memory cells each assigned a row address and a column address; b) a plurality of sets of word lines respectively associated with the plurality of memory cell arrays, and each having a plurality of word lines respectively coupled to the rows of memory cells of the associated memory cell array for selectively making the rows of memory cells accessible; c) a plurality of sets of bit line pairs respectively associated with the plurality of memory cell arrays, and each having a plurality of bit line pairs respectively coupled to the columns of memory cells for producing potential differences indicative of data bits read out from one of the rows of memory cells; d) a bank addressing system responsive to an external bank address signal for selectively enabling the plurality of memory cell arrays; e) a row addressing system for selecting one of the word lines associated with the memory cell array enabled with the external bank address signal, and having e-1) a row address buffer unit operative to store an external row address signal indicative of the row address assigned to one of the rows of memory cells incorporated in each memory cell array, and e-2) a plurality of row address decoder units each shared between two of the plurality of memory cell arrays, and operative to energize one of the word lines coupled to the row of memory cells specified by the external row address signal and incorporated in the memory cell array enabled with the external bank address signal; f) a plurality of sets of sense amplifier circuits respectively associated with the plurality of sets of bit line pairs, and each operative to amplify potential differences on the bit lines of the associated set for storing the potential differences; g) a column addressing system responsive to an external column address signal sequentially specifying the column addresses in the page mode for sequentially coupling bit line pairs of the set associated with the memory cell array specified with the external bank address signal to a data bus; h) an interface unit coupled to the data bus, and operative to produce an output data signal from the potential difference on the data bus and the potential difference on the data bus from an input data signal; and i) an internal control signal generating unit responsive to external control signals, and operative to produce a plurality of internal control signals for controlling the page mode.

The row address buffer unit may cancel the external row address signal in response to a first internal control signal, and the sense amplifier circuits may cancel the potential difference in response to a second internal control signal independently of the first internal control signal.

BRIEF DESCRIPTION OF THE DRAWINGS

The features and advantages of the random access memory device according to the present invention will be more clearly understood from the following description taken in conjunction with the accompanying drawings in which.

DESCRIPTION OF THE PREFERRED EMBODIMENTS

First Embodiment

Figure 1:
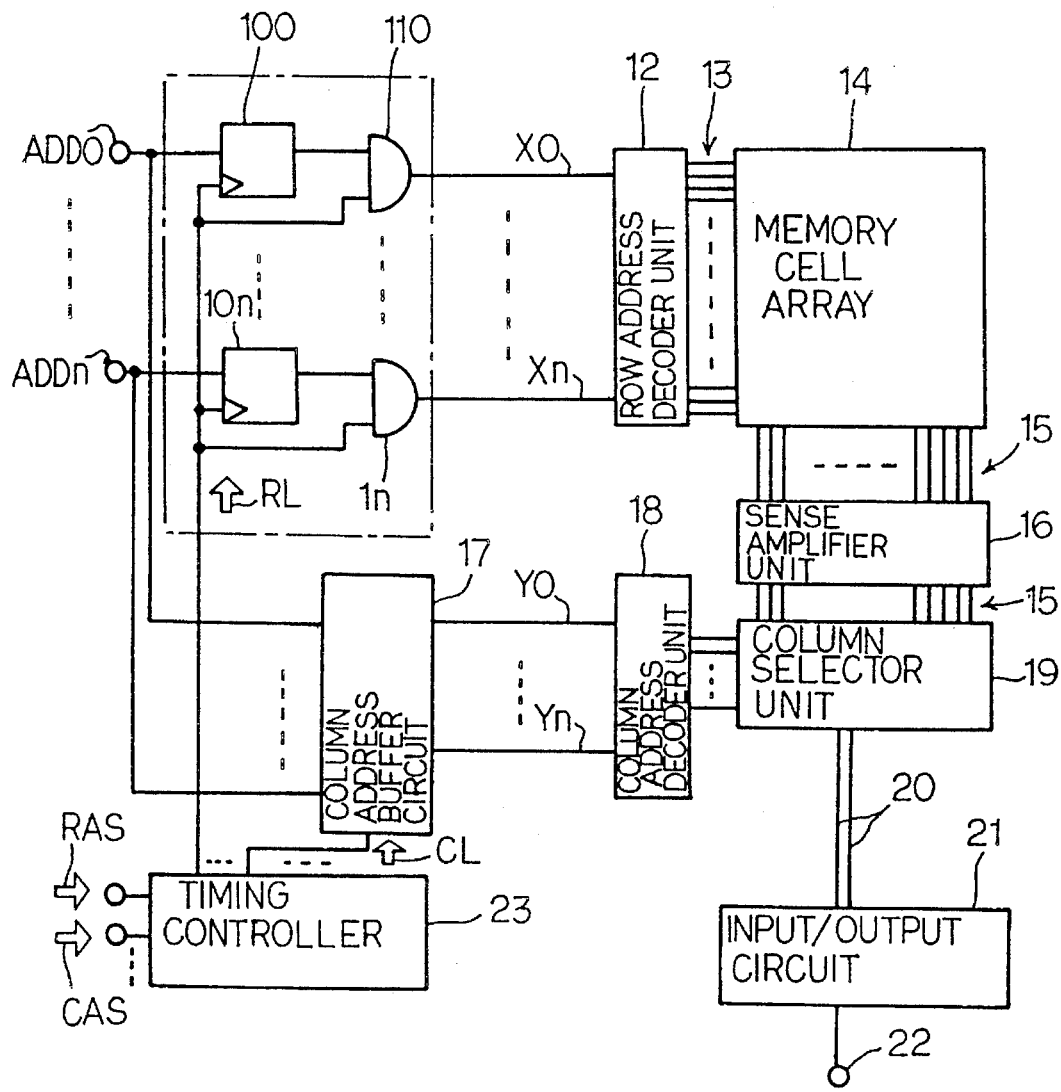
FIG. 1 is a block diagram showing the arrangement of the prior art dynamic random access memory device.
Figure 2:
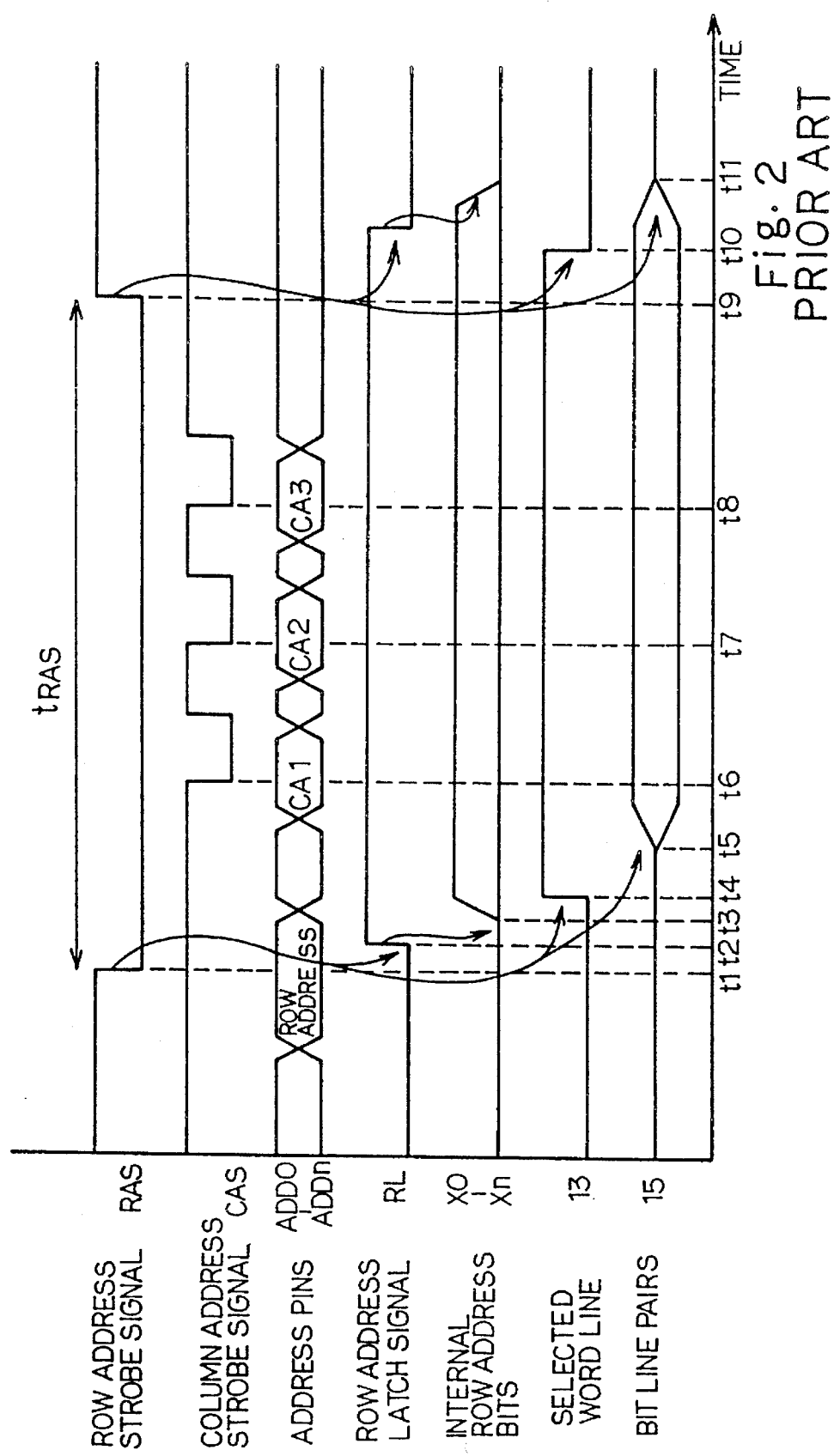
FIG. 2 is a timing chart showing the prior art sequential access in the page mode.
Figure 3:
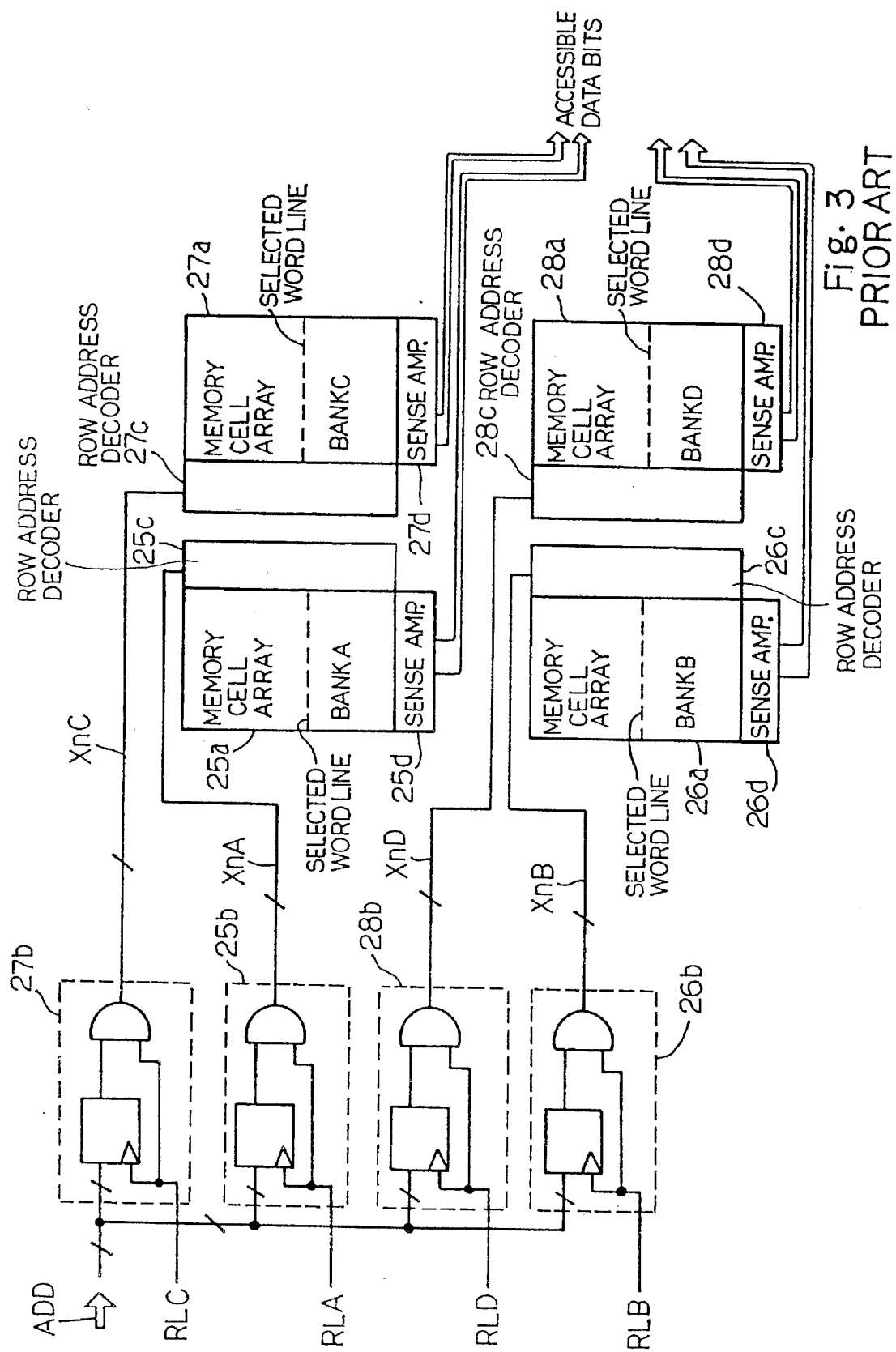
FIG. 3 is a block diagram showing the prior art dynamic random access memory device with the sense amplifier circuits serving as a cache memory.
Figure 4:
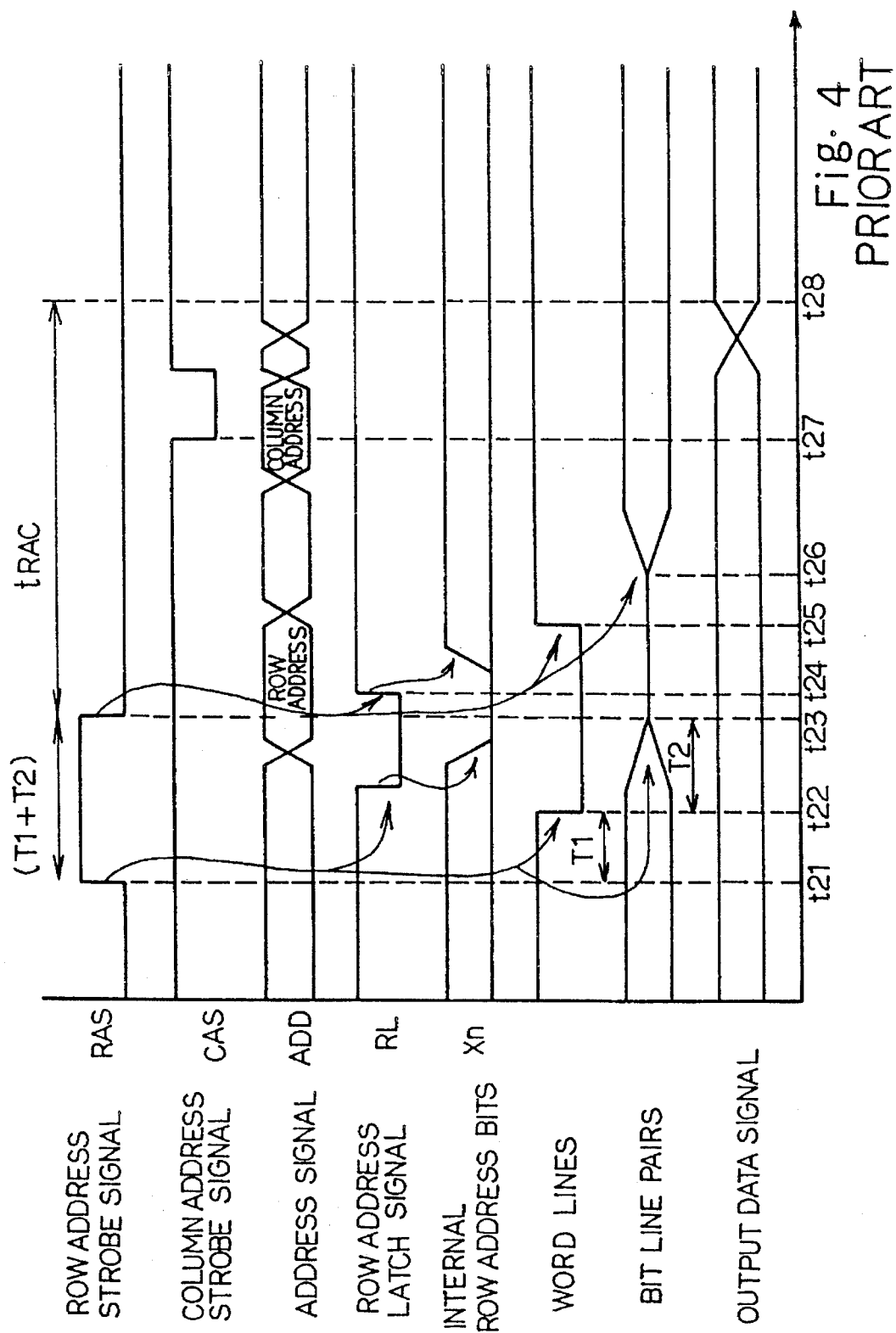
FIG. 4 is a timing chart showing the row address change in the prior art dynamic random access memory device shown in FIG. 3.
Figure 5:
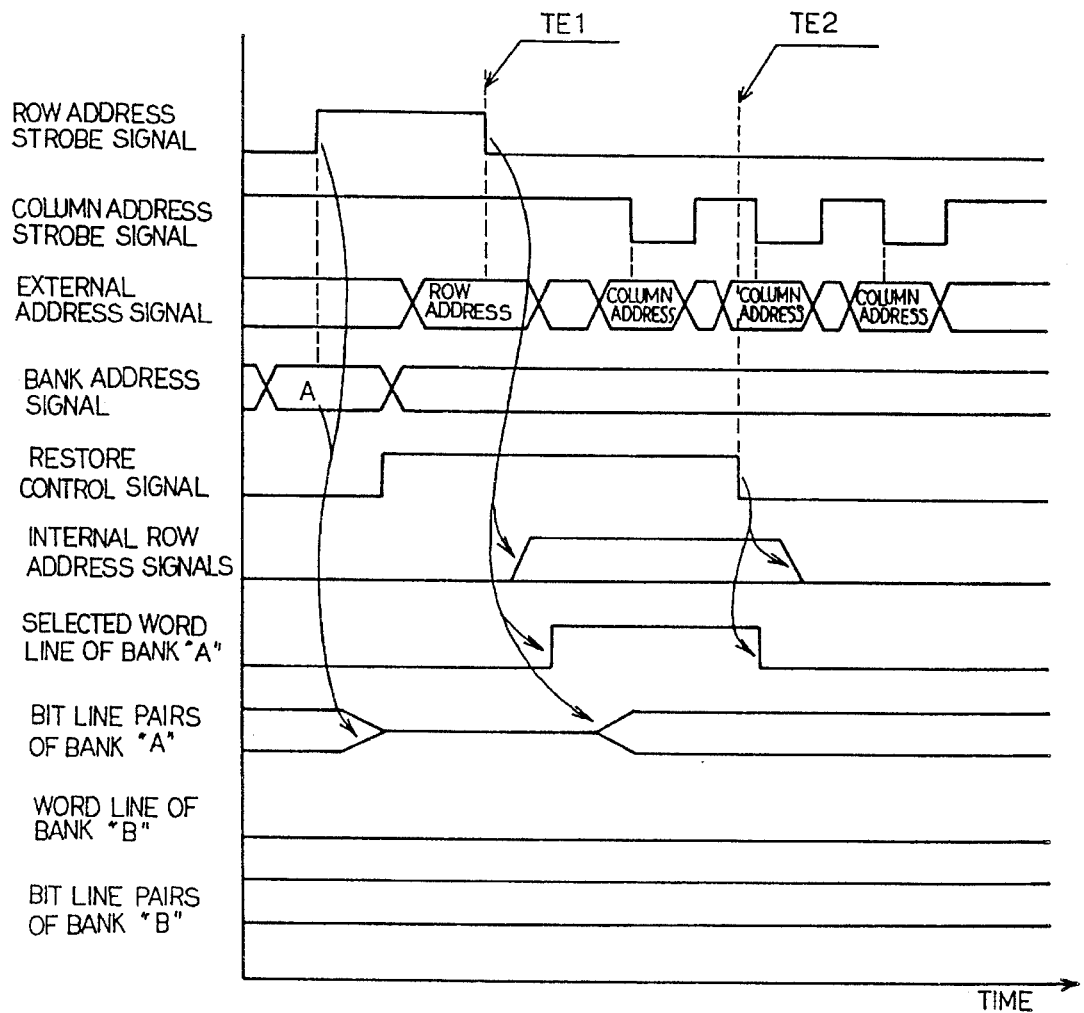
FIG. 5 is a timing chart illustrating the concept of the present invention.

Referring to FIG. 5 of the present invention, a dynamic random access memory device embodying the present invention is fabricated on a single semiconductor chip 31, and is operable in a page mode. The dynamic random access memory device comprises memory cell arrays 32a, 32b, 32c and 32d called as BANK "A", BANK "B", BANK "C" and BANK "D", respectively, and these memory cell arrays 32a to 32d are similar in arrangement to one another. Each of the memory cell arrays 32a to 32d is implemented by a plurality of memory cells arranged in rows and columns, and each memory cell is a series combination of an n-channel enhancement type switching transistor and a storage capacitor (not shown). A data bit is stored in the storage capacitor in the form of electric charge. The memory cells of the memory cell array 32a is represented by small circles. In this instance, one of the memory cell arrays 32a to 32d is enabled, and data bits stored therein become accessible.

Four sets of word lines WLA1, WLA2, ..., WLA1 and WLAm, WLB1, WLB2, ..., WLB1 and WLBm, WLC1, WLC2, ..., WLC1 and WLCm and WLD1, WLD2, ..., WLD1 and WLDm are respectively associated with the memory cell arrays 32a to 32d, and four sets of bit line pairs BLA1 to BLAn, BLB1 to BLBn, BLC1 to BLCn and BLD1 to BLDn are further associated with the memory cell arrays 32a to 32d, respectively. The word lines of each set are respectively coupled to the gate electrode of the n-channel enhancement type switching transistors of the rows of memory cells, and the bit line pairs of each set are respectively coupled to the drain nodes of the n-channel enhancement type switching transistors of the columns of memory cells. When one of the word lines is changed to a boosted voltage level over a positive power voltage level, the n-channel enhancement type switching transistors of the associated row concurrently turn on, and couple the storage capacitors to the associated bit lines. The charge packets stored in the storage capacitors are transferred to the associated bit lines, and form potential differences between the associated bit lines and other bit lines paired therewith.

The dynamic random access memory device embodying the present invention further comprises precharge/balance units 33a, 33b, 33c and 33d, and the precharge/balance units 33a to 33d are respectively associated with the memory cell arrays 32a to 32d. The precharge/balance units 33a to 33d are connected between a positive power voltage line and the bit line pairs BLA1 to BLAn, BLB1 to BLBn, BLC1 to BLCn and BLD1 to BLDn, and are responsive to a precharge control signal PC for balancing the bit line pairs at a precharged voltage level. The precharge/balance unit associated with the enabled memory cell array is enabled for balancing the associated bit lines.

The dynamic random access memory device embodying the present invention further comprises sense amplifier units 34a, 34b, 34c and 34d respectively associated with the memory cell arrays 32a to 32d, and the sense amplifier units 34a to 34d are connected to the sets of bit line pairs BLA1 to BLAn, BLB1 to BLBn, BLC1 to BLCn and BLD1 to BLDn, respectively. A plurality of differential amplifier circuits are incorporated in each of the sense amplifier units 34a to 34d, and are activated with an activation signal ACT2. The differential amplifier circuits thus activated develop the potential differences on the associated bit line pairs, and maintain the potential differences until the associated precharge/balance unit equalize the associated bit line pairs at the precharge level. Thus, the sense amplifier units 34a to 34d serve as cache memory units.

The dynamic random access memory device embodying the present invention further comprises a bank addressing system for selecting one of the memory cell arrays 32a to 32d. The bank addressing system comprises an address buffer unit 35a responsive to a bank address latch signal BL for storing bank address signal indicative of one of the four banks BANK "A", BANK "B", BANK "C" and BANK "D" and bank address decoder unit 35b for producing bank address decoded signals BKA, BKB, BKC and BKD from bank address predecoded signals from the address buffer unit 35a. The bank address decoded signals are associated with the memory cell arrays 32a to 32d, respectively, and are selectively changed to an active level. One of the memory cell arrays 32a to 32d becomes accessible with the bank address decoded signal of the active level.

The dynamic random access memory device embodying the present invention further comprises a row addressing system for selectively energizing the word lines. The row addressing system comprises a row address buffer unit 36a coupled to address pins (not shown) and two row address decoder units 36b and 36c each shared between two memory cell arrays 32a/32b and 32c/32d. The row address buffer unit 36a is enabled with an activation signal ACT1 of a low voltage level, and responsive to a row address latch signal RL for storing a row address signal. When the activation signal ACT1 is recovered to the high voltage level, the row address buffer unit 36a resets the row address signal, and accordingly, the row address decoder unit discharges the selected word line. Each of the row address decoder units 36b and 36c serve for one of the two sets of word lines WLA1 to WLAm/WLB1 to WLBm or WLC1 to WLCm/WLD1 to WLDm depending upon the bank address decoded signals BKA/BKB or BKC/BKD.

Figure 7:
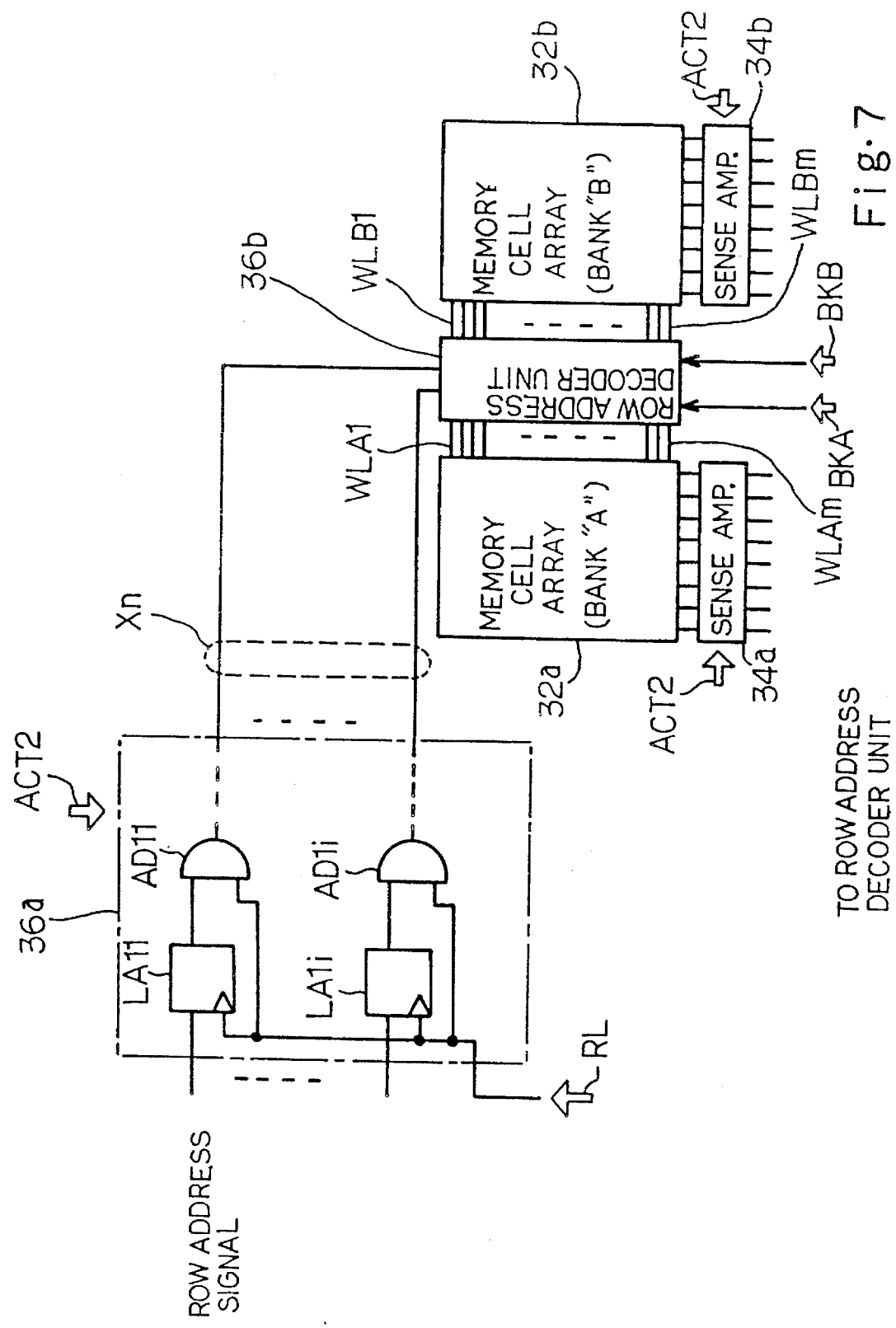
FIG. 7 is a block diagram showing the arrangement of a row address buffer unit and a row address decoder unit shared between memory cell arrays incorporated in the dynamic random access memory device according to the present invention.

As will be better seen from FIG. 7, an essential part of the row address buffer unit 36a has an array of latch circuits LA11 to LA1i and an array of AND gates AD11 to AD1i. The latch circuits LA11 to LA1i are responsive to the row address latch signal RL for storing the row address signal, and the AND gates AD11 to AD1i are enabled with the row address latch signal RL.

The row address buffer unit 36a is responsive to the row address latch signal RL for storing the row address signal, and produces row address predecoded signals Xn. The row address predecoded signals are supplied to the row address decoder units 36b and 36c.

Though not shown in the drawings, each of the row address decoder unit 36b and 36c has an address decoder shared between the two memory cell arrays and two word line drivers respectively coupled to the two sets of word lines. Therefore, four word line drivers are respectively coupled to the four sets of word lines WLA1 to WLAm, WLB1 to WLBm, WLC1 to WLCm and WLD1 to WLDm, and the bank address decoded signals BKA to BKC selectively enable the four word line drivers.

Thus, each row address decoder is shared between the two memory cell arrays 32a/32b and 32c/32d, and the number of row address decoders is decreased rather than the prior art dynamic random access memory device.

When the row address predecoded signals are supplied to the row address decoder units 36b and 36c, the row address decoders produce row address decoded signals, and only one word line drivers boosts one of the word lines of the associated set over the positive power voltage level.

Turning back to FIG. 6 of the drawings, the dynamic random access memory device embodying the present invention further comprises a column addressing system which in turn comprises a column address buffer unit 37a coupled to the address pins (not shown), a column address decoder unit 37b coupled to the column address buffer unit 37a and a column selector sub-system 37c. The column address buffer unit 37a is responsive to a column address latch signal CL for storing a column address signal, and produces column address predecoded signals. The column address predecoded signals are supplied to the column address buffer unit 37b, and the column address decoder unit 37b changes one of the column address decoded signals to an active level.

The column selector sub-system 37c have four column selector circuits respectively coupled to the four sets of bit line pairs BLA1 to BLAn, BLB1 to BLBn, BLC1 to BLCn and BLD1 to BLDn, and transfers the potential difference on the selected bit line pair to a data bus DB.

The dynamic random access memory device embodying the present invention further comprises an input/output unit 38 coupled between the data bus DB and a data pin Pdb. The input/output unit 38 is responsive to an output enable signal IOE, and produces an output data signal Sout from the potential difference on the data bus in a read-out phase of operation. The input/output circuit 38 is further operative to produce a potential difference indicative of a write-in data bit at the data pin Pdb in a write-in phase of operation, and supplies the potential difference on the data bus.

The dynamic random access memory device further comprises an internal control signal generating unit 39 coupled to external control signal pins, and a plurality of internal control signal generating circuits form in combination the internal control signal generating unit 39. Various external control signals such as, for example, a row address strobe signal RAS, a restore control signal RSTR, a column address strobe signal CAS and a write enable signal WE are supplied through the external control signal pins to the internal control signal generating unit 39. The internal control signal generating unit 39 produces internal control signals at appropriate timings, and the block address latch signal BL, the row address latch signal RL, the column address latch signal CL, the activation signal ACT1 for the row address buffer unit 36a, the activation signal ACT2 for the sense amplifier units 34a to 34d, the output enable signal IOE and the precharge control signal PC are examples of the internal control signals.

Figure 8:
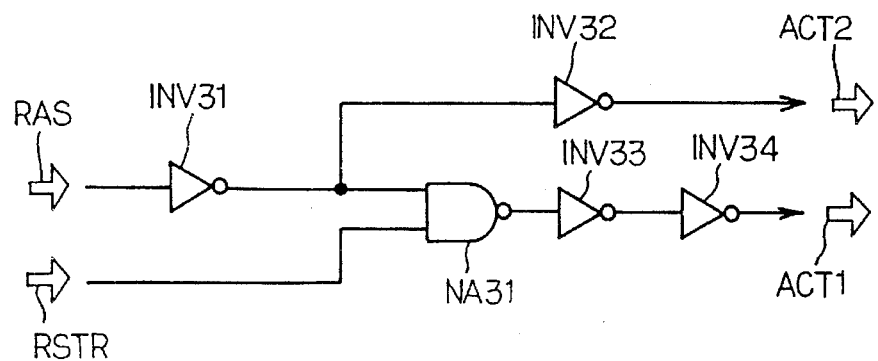
FIG. 8 is a logic diagram showing the arrangement of an internal control signal generating circuit incorporated in the dynamic random access memory device according to the present invention.

Turning to FIG. 8 of the drawings, one of the internal control signal generating circuits is illustrated in detail, and is used for producing the activation signals ACT1 and ACT2. The internal control signal generating circuit comprises four inverters INV31, INV32, INV33 and INV34 and a NAND gate NA31, and the row address strobe signal RAS and the restore control signal RSTR are supplied to the inverter INV31 and the NAND gate NA31, respectively. The inverter INV32 produces the activation signal ACT2 for the sense amplifier units 34a to 34d from only the complementary signal of the row address strobe signal RAS. However, the complementary signal of the row address strobe signal RAS is NANDed with the restore control signal RSTR, and the output signal of the NAND gate NA31 is twice inverted for producing the activation signal ACT1 for the row address buffer unit 36a. Thus, the activation signal ACT1 is produced from the two external control signals RAS and RSTR, and either external control signal RAS or RSTR can change the potential level of the activation signal ACT1.

Figure 9:
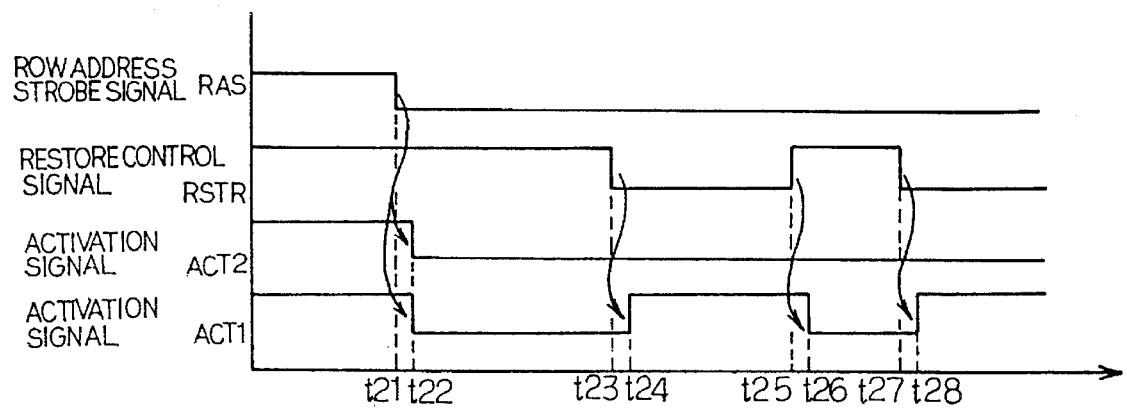
FIG. 9 is a timing chart showing the behavior of the internal control signal generating circuit.

FIG. 9 illustrates the circuit behavior of the internal control signal generating circuit. Assuming now that the row address strobe signal RAS is changed from the high voltage level to the low voltage level at time t21, the inverters INV31 and INV32 twice invert the row address strobe signal RAS, and the inverter INV32 shifts the activation signal ACT2 to the active low voltage level at time t22. The NAND gate NA31 is enabled with the restore control signal RSTR of the high voltage level at time t21, and, accordingly, responds to the complementary signal of the row address strobe signal RAS. The inverters INV33 and INV34 twice invert the output signal of the NAND gate NA31, and the inverter INV34 shifts the activation signal ACT1 to the active low voltage level. As a result, the row address buffer unit 36a and the associated sense amplifier unit start the row address predecoding and the development of the potential differences.

If the restore control signal RSTR is changed to the low voltage level at time t23, the NAND gate NA31 changes the output signal thereof, and, accordingly, the inverter INV34 changes the activation signal ACT1 to the high voltage level at time t24. However, the activation signal ACT2 is not affected by the change of the restore control signal RSTR. As a result, the row address buffer unit 36a resets the row address signal and, accordingly, the row address predecoded signals, and the selected word line is reset independently from the control of the associated sense amplifier unit. When the restore control signal RSTR is repeatedly changed at times t25 and t27, the activation signal ACT1 is synchronized with the restore control signal RSTR at times t26 and t28.

Figure 10:
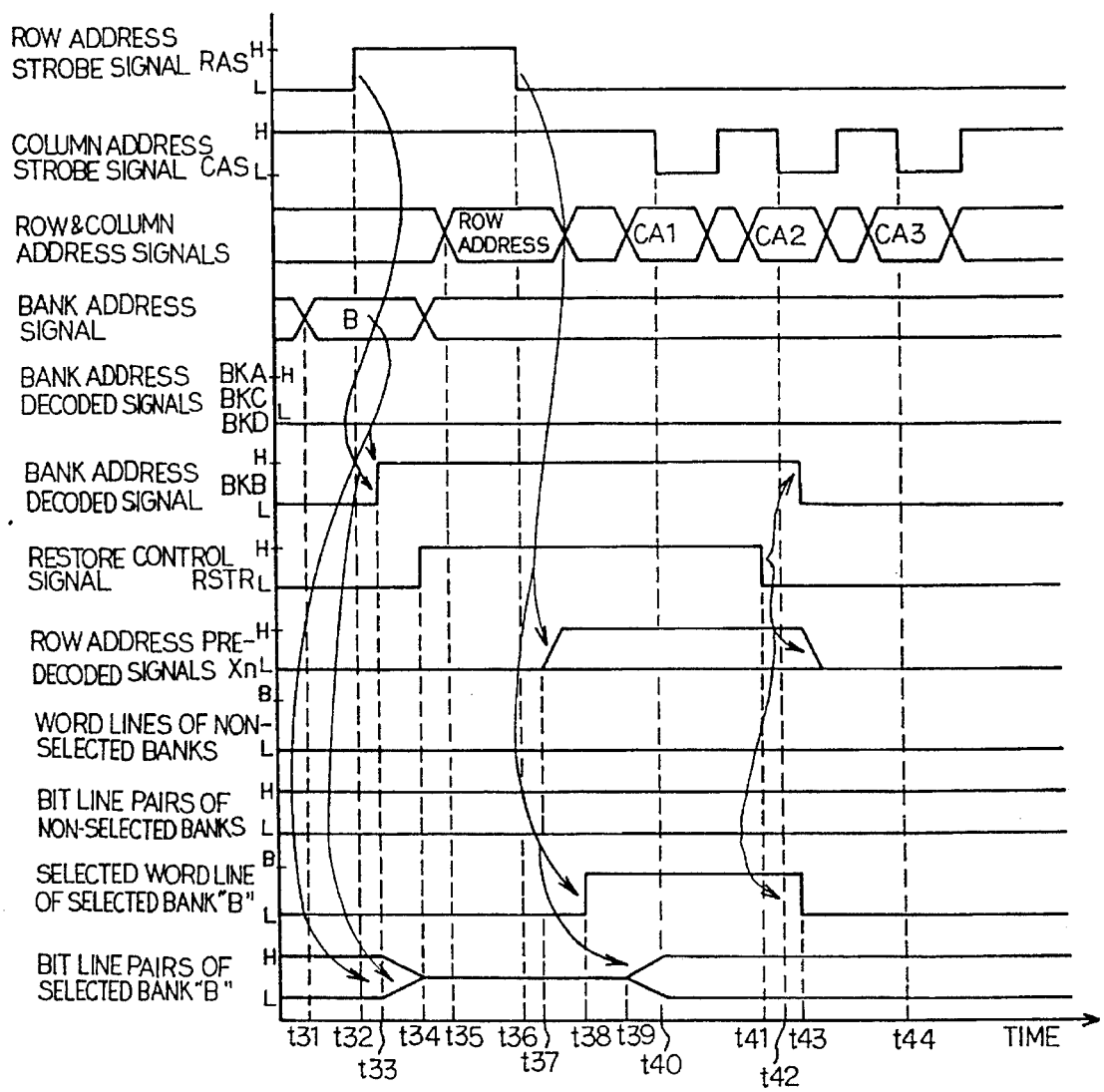
FIG. 10 is a timing chart showing a page mode operation on one of the memory cell arrays incorporated in the dynamic random access memory device according to the present invention.
Figure 11:
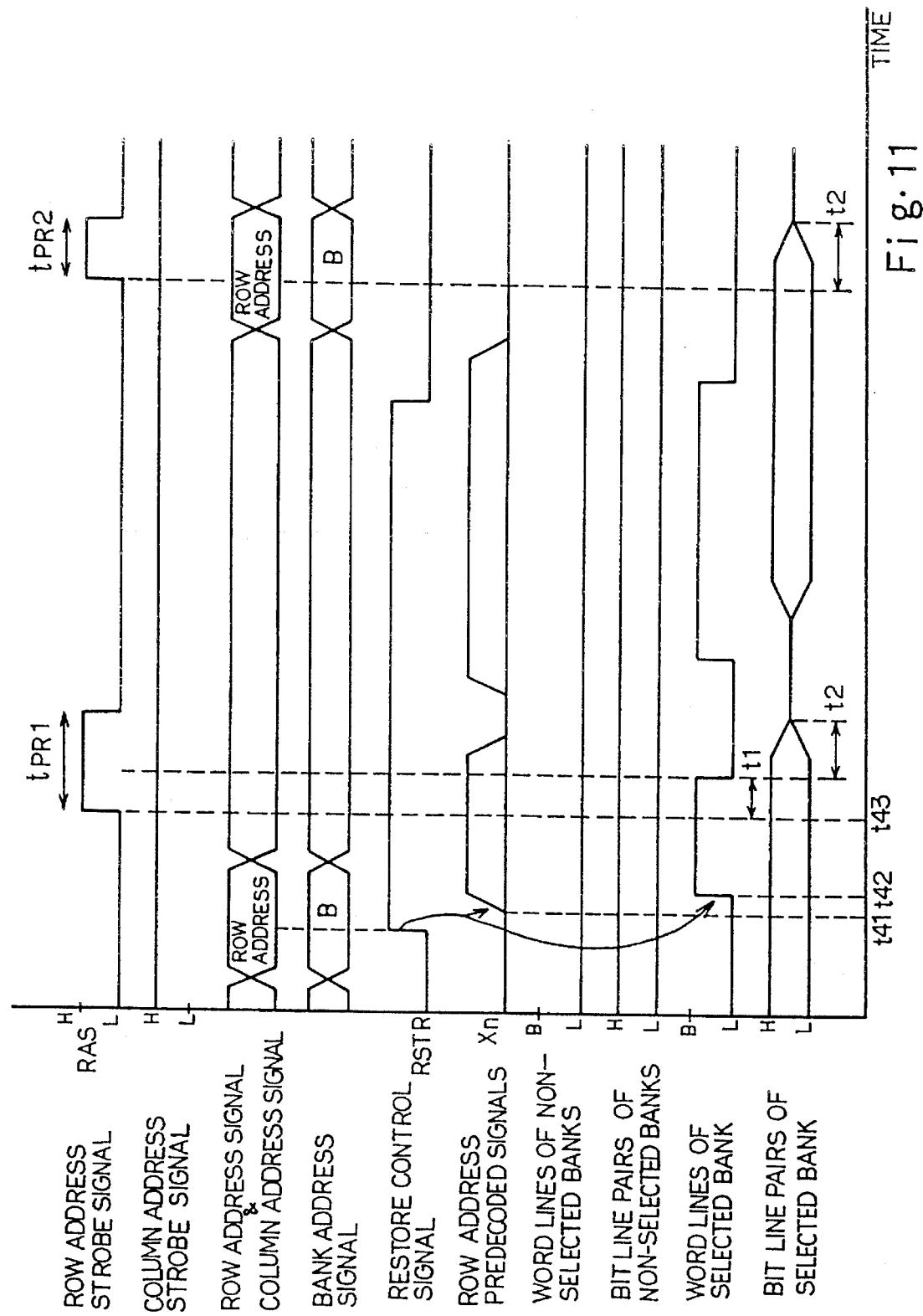
FIG. 11 is a timing chart showing a write-in sequence partially overlapped with a read-out sequence carried by the dynamic random access memory device shown in FIG. 6.

Description is made on the page mode of operation with reference to FIG. 10 of the drawings. Assuming now that all of the sense amplifier units 34a to 34d have stored the potential differences indicative of the data bits read out from the associated memory cell arrays 32a to 32d, the bit line pairs BLA1 to BLAn, BLB1 to BLBn, BLC1 to BLCn and BLD1 to BLDn are keeping the developed potential differences, and all of the word lines WLA1 to WLAm, WLB1 to WLBm, WLC1 to WLCm and WLD1 to WLDm are recovered to the inactive low voltage level.

If the bank address signal is changed to the bank address assigned to the memory cell array 32b or BANK "B" at time t31, the internal control signal generating unit 39 produces the bank address latch signal BL in synchronism with the leading edge of the row address signal RAS at time t32, and the address buffer unit 35a latches the external bank address signal in response to the bank address latch signal BL. The address buffer unit 35a supplies the bank address predecoded signals to the bank address decoder unit 35b, and the bank address decoder unit 35b changes the bank address decoded signal BKB to the active high voltage level at time t33. However, the other bank address decoded signals BKA, BKC and BKD remain in the inactive low voltage level.

The internal control signal generating unit 39 further produces the precharge control signal PC in response to the rise of the row address strobe signal RAS, and the precharge/balance circuit 33b is enabled with the bank address decoded signal BKB so as to respond to the precharge control signal PC. The sense amplifier unit 34b becomes inactive in response to the bank address decoded signal BKB, and the other bank address decoded signals BKA, BKC and BKD allow the associated sense amplifier units 34a, 34c and 34d to remain active. As a result, the bit line pairs BLB1 to BLBn are balanced at the precharge level. However, the other bit line pairs BLA1 to BLAn, BLC1 to BLCn and BLD1 to BLDn maintain the potential differences.

Upon completion of the balancing operation on the bit line pairs BLB1 to BLBn, the restore control signal RSTR is recovered to the high voltage level at time t34, and the NAND gate NA31 is enabled with the restore control signal RSTR of the high voltage level.

The external row address signal is changed to a row address assigned to one of the rows of memory cells at time t35, and the inverters INV32 and INV34 change the activation signals ACT2 and ACT1 to the active low voltage level. With the activation signals ACT1 and ACT2, the row address buffer unit 36a becomes active, and the sense amplifier unit 34b becomes active again.

The internal control signal generating unit 39 produces the row address latch signal RL, and the row address buffer unit 36a latches the external row address signal in response to the row address latch signal RL. The row address predecoded signals Xn are supplied to the row address decoder units 36b and 36c at time t37, and only the row address decoder unit 36b responds to the row address predecoded signals Xn for the memory cell array 32b. Namely, the bank address decoded signal BKB allows the row address decoder unit 36b to select one of the word lines W1B1 to WLBm on the basis of the row address predecoded signals Xn, and the other bank address decoded signals BKA, BKC and BKD do not allow the row address decoder units 36b and 36c to energize the associated word lines WLA1 to WLAm, WLC1 to WLCm and WLD1 to WLDm. For this reason, only one of the word lines WLB1 to WLBm assigned the row address is energized at time t38.

The memory cells coupled to the selected word line supply the data bits to the associated bit line pairs BLB1 to BLBn, and small potential differences are produced on the bit line pairs BLB1 to BLBn. The sense amplifier unit 34b develops the small potential differences, and completes the amplification at time t39. As a result, the four sense amplifier units 34a to 34d maintain the four groups of potential differences indicative of the read-out data bits again.

The column address signal is assumed to be sequentially changed to the column addresses CA1, CA2 and CA3. The internal control signal generating unit 39 produces the column address latch signal CL in synchronism with the trailing edges of the column address strobe signal CAS at time t40, time t42 and time t44, and the column address buffer unit 37a memorizes the column addresses CA1, CA2 and CA3. The column address decoder unit 37b causes the column selector sub-system to sequentially transfer the data bits on the selected bit line pairs to the data bus DB. The input/output unit 38 changes the output data signal Sout so that the selected data bits are sequentially delivered to a destination.

The restore control signal RSTR is recovered to the low voltage level at time t41, and the NAND gate NA31 and the inverter INV34 change the activation signal ACT1 to the inactive high voltage level. With the activation signal ACT1, the row address buffer unit 36a cancels the row address signal, and the selected word line is changed to the inactive level at time t43. For this reason, the row addressing system is ready for response to the external row address signal indicative of another row address. Moreover, the row address strobe signal RAS is maintained until the next access to data bits stored in another row address regardless of the maximum value of the time period tRAS, because the selected word line is discharged under the row address strobe signal RAS maintained in the active low voltage level.

If the input data signal is supplied to the input/output unit 38 between the recovery of the word line and the precharging operation, the restore control signal RSTR is changed to the high voltage level at time t41, and the NAND gate N31 is enabled with the restore control signal RSTR again. As a result, the row address buffer unit 36a is activated with the activation signal ACT1 again, and the row address decoder unit 36b energizes the word line with the row address indicated by the row address signal for storing the write-in data bit in the memory cell at time t42.

If the row address strobe signal RAS rises at time t43, the precharging operation starts after the recovery of the selected word line. However, the row address strobe signal RAS rises before the recovery of the selected word line, and the write-in sequence is partially overlapped with the read-out sequence. For this reason, although the time period $T_{pR}1$ is longer then the time period $T_{pR}2$, the total time period for the write-in operation and the read-out operation is shorter than that of the non-overlapped sequence.

As will be appreciated from the foregoing description, each of the row address decoder units 36b and 36c is shared between the two memory cell arrays 32a and 32b or 32c and 32d, and the row addressing system does not occupy wide area. As a result, the dynamic random access memory device is integrated on a small semiconductor chip.

Moreover, the latch of the row address signal is independent of the precharging operation, and the row address buffer unit 36a allows the row addressing system to become ready for changing a selected word line without interruption of the sequential access in the page mode.

Finally, the maximum time period $t_{RAS}$ does not have an influence on the control of word lines, and the complex control of word lines is not required.

Second Embodiment

Figure 12:
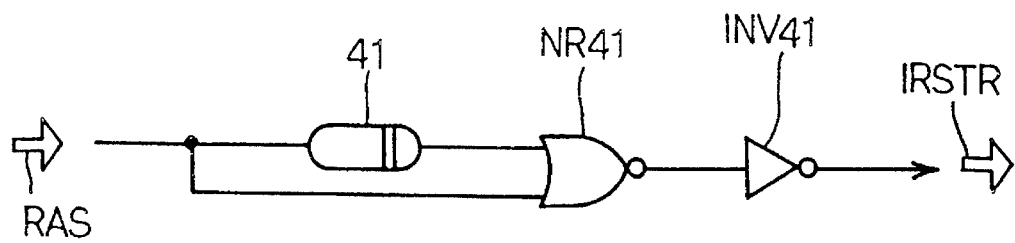
FIG. 12 is a logic diagram showing an internal control signal generating circuit incorporated in another dynamic random access memory device according to the present invention for internally producing a restore control signal.

Turning to FIG. 12 of the drawings, an internal control signal generating circuit incorporated in another dynamic random access memory device comprises a NOR gate NR41, a delay circuit 41 and an inverter INV41 for producing an internal restore control signal IRSTR, and this internal control signal generating circuit is newly added to the components of the dynamic random access memory device implementing the first embodiment.

The delay circuit 41 introduces time delay equivalent to the time period consumed between the decay of the row address strobe signal RAS and the completion of the sense amplification. In the first embodiment, the activation signals ACT1 and ACT2 are produced from the row address strobe signal RAS and the restore control signal RSTR both supplied from the outside of the dynamic random access memory device. The internal control signal generating circuit internally produces the restore control signal IRSTR, and the restore control signal RSTR is replaced with the internal restore control signal IRSTR.

Figure 13:
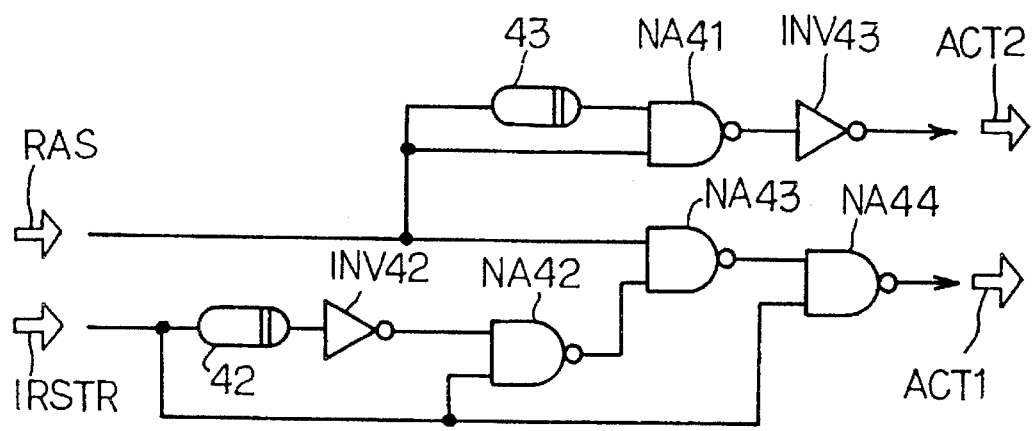
FIG. 13 is a logic diagram showing another internal control signal generating circuit for producing activation signals.

In the second embodiment, the internal control signal generating circuit shown in FIG. 8 is replaced with an internal control signal generating circuit shown in FIG. 13. The internal control signal generating circuit shown in FIG. 13 comprises two delay circuits 42 and 43, two inverters INV42 and INV43 and four NAND gates NA41, NA42, NA43 and NA44. The delay time introduced by the delay circuit 43 is longer than the delay time introduced by the delay circuit 42. The delay circuit 43, the NAND gate NA41 and the inverter INV43 produce the activation signal ACT2 from the row address strobe signal RAS, and the delay circuit 42, the inverter INV42 and the NAND gates NA42, NA43 and NA44 produce the activation signal ACT1 from the row address strobe signal RAS and the internal restore control signal IRSTR.

Figure 6:
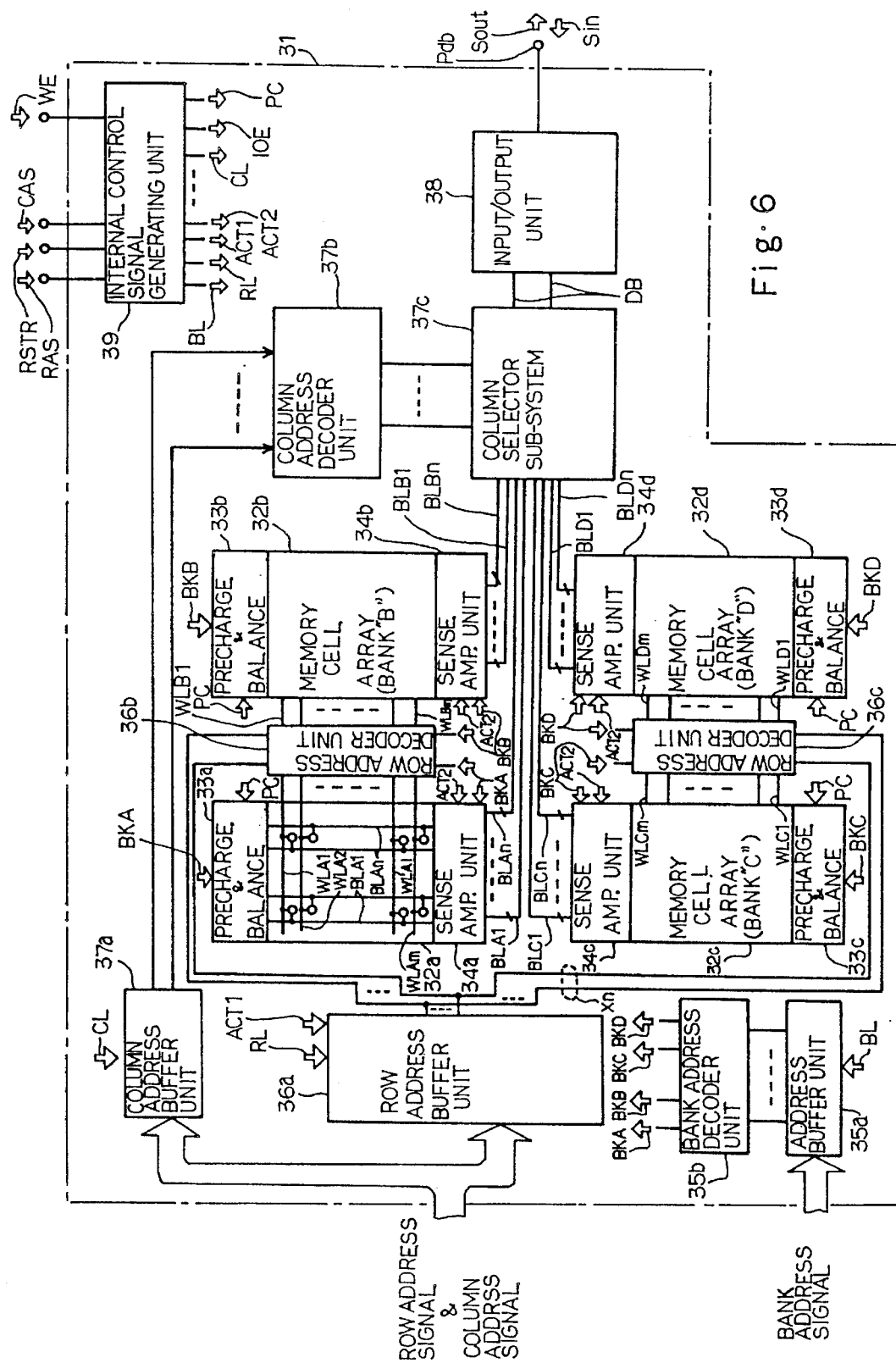
FIG. 6 is a block diagram showing the circuit arrangement of a dynamic random access memory device according to the present invention.

The other circuit arrangement of the dynamic random access memory device implementing the second embodiment is similar to the dynamic random access memory device shown in FIG. 6, and the second embodiment similarly traces the sequence shown in FIG. 10. The components of the second embodiment are hereinbelow identified by using the references used in the description on the first embodiment.

Figure 14:
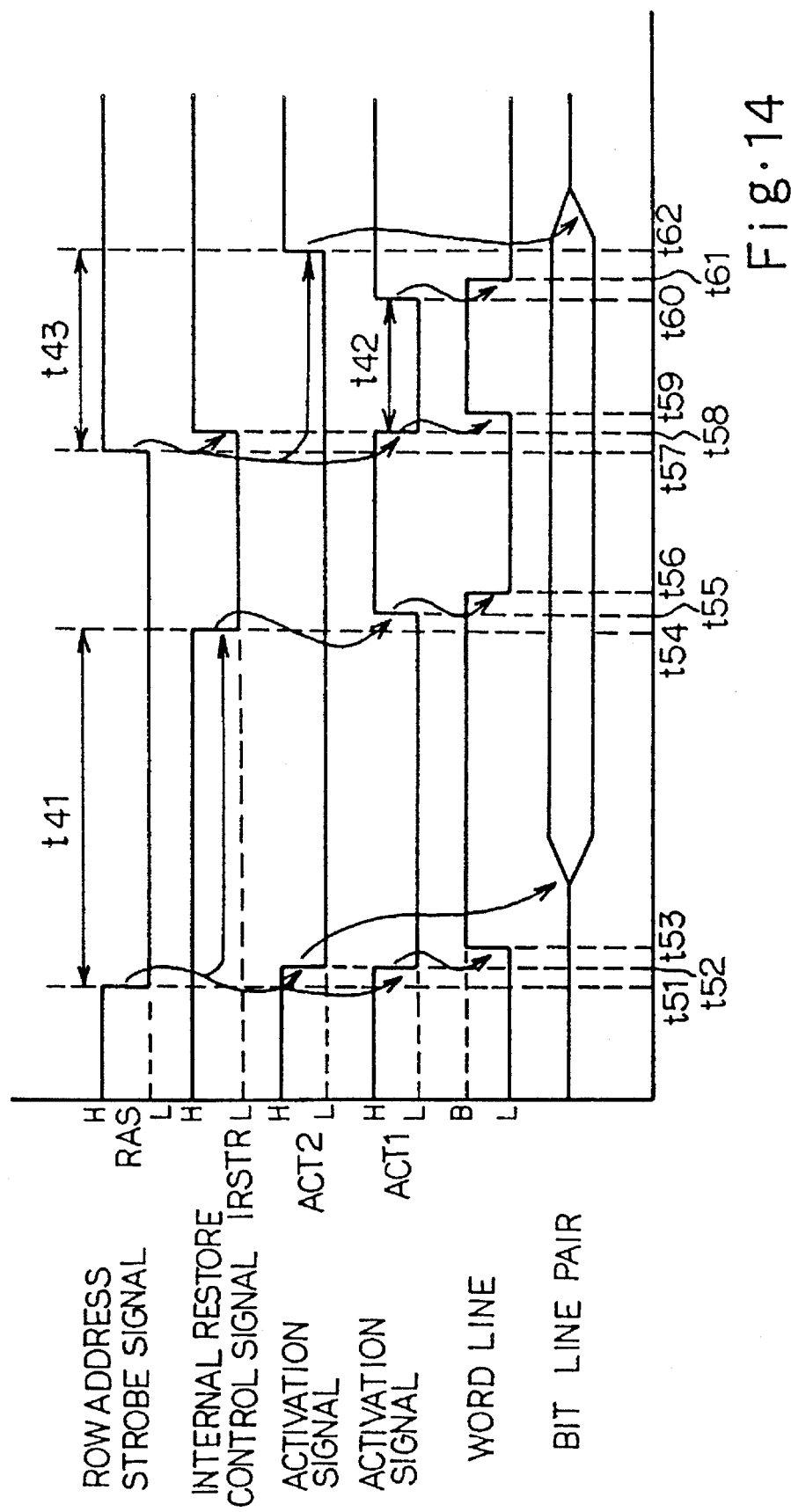
FIG. 14 is a timing chart showing the circuit behavior of the internal control signal generating circuit shown in FIG. 13.

The internal control signal generating circuit shown in FIG. 13 behaves as follows. As shown in FIG. 14, while the row address strobe signal RAS is staying in the high voltage level, the internal restore control signal IRSTR is also in the high voltage level, and both activation signals ACT1 and ACT2 remain in the inactive low voltage level.

If the row address strobe signal RAS goes down to the low voltage level at time t51, the inverter INV43 and the NAND gate NA44 change the activation signals ACT2 and ACT1 to the low voltage level at time t52. Then, the sense amplifier unit 34a/34b/34c/34d associated with the selected bank is activated for sense amplification, and the row address buffer unit 36a becomes ready for storing a row address signal.

After the delay time t41 introduced by the delay circuit 41 is expired, the internal restore control signal IRSTR goes down to the low voltage level at time t54, and the NAND gate NA44 changes the activation signal ACT1 to the high voltage level at time t55. As a result, the row address buffer unit 36a cancels the row address signal stored therein, and the selected word line is discharged at time t56. However, the activation signal ACT1 remains in the active low voltage level, and the sense amplifier unit continuously serves as a cache memory.

If the row address strobe signal RAS goes up to the high voltage level at time t57, the internal restore control signal IRSTR is changed to the high voltage level at time t58, and the NAND gate NA44 concurrently changes the activation signal ACT1 to the low voltage level again. Therefore, the row address buffer unit 36a latches the row address signal again, and the word line is boosted over the positive power voltage level at time t59.

If the time delay introduced by the delay circuit 42 is expired at time t60, the NAND gate NA44 changes the activation signal ACT1 to the high voltage level, and the selected word line is decayed to the low voltage level at time t61.

If the time delay introduced by the delay circuit 43 is expired at time t62, the inverter INV43 changes the activation signal ACT2 to the high voltage level, and the associated precharge/balance unit becomes ready for balancing operation on the associated bit line pairs.

The internal control signal generating circuit shown in FIG. 13 allows an external device to rewrite a data bit stored in the memory cell array 32b of the dynamic random access memory device between the discharge of the selected word line and the precharge of the bit lines.

Figure 15:
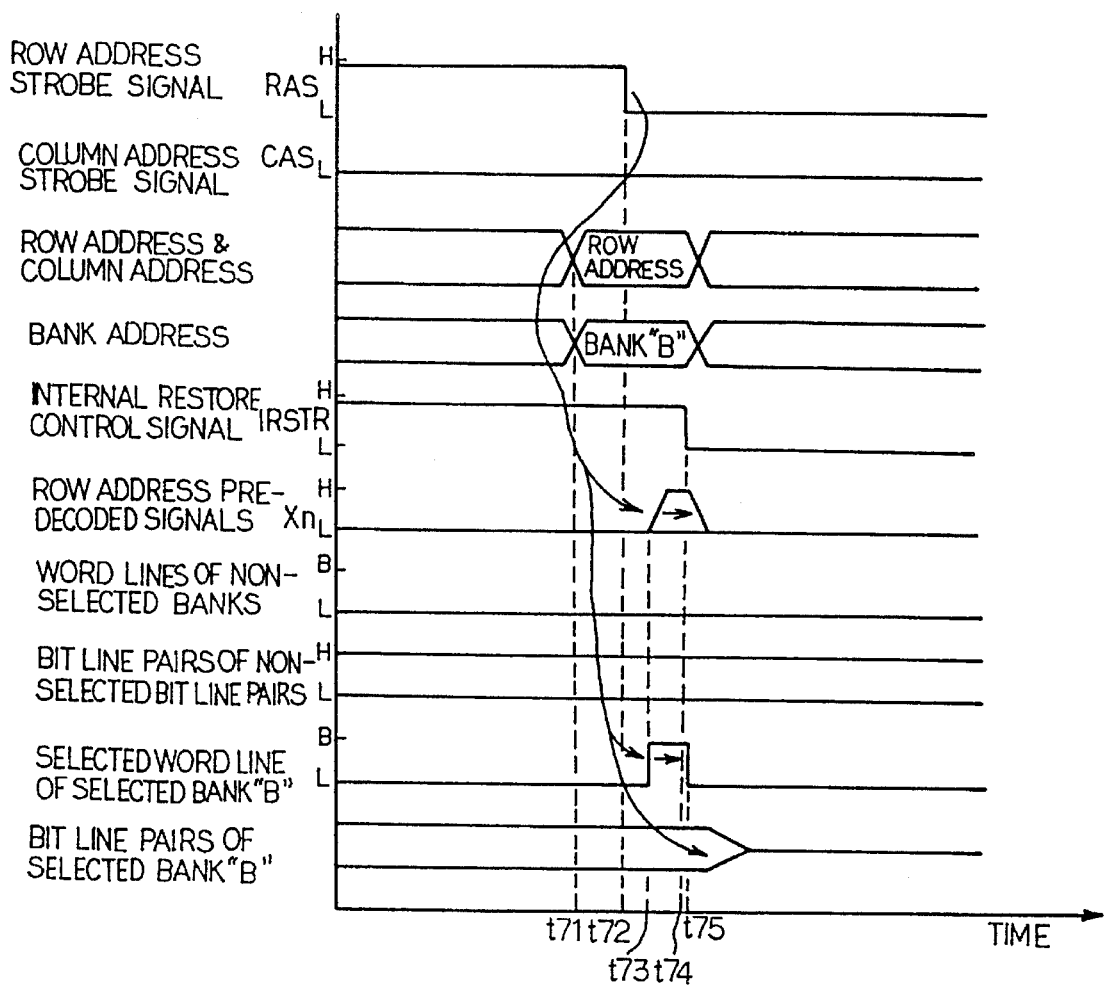
FIG. 15 is a timing chart showing the write-in operation carried out by the dynamic random access memory device according to the present invention.

In detail, the external device supplies the row address signal indicative of the row address assigned to the memory cell to be rewritten and the bank address signal indicative of BANK "B" are supplied to the dynamic random access memory device at time t71 (see FIG. 15), and the input data signal Sin indicative of the new data bit is supplied to the data pin Pdb.

The external device changes the row address strobe signal RAS to the high voltage level at time t72, and the NAND gate NA44 concurrently changes the activation signal ACT1 to the active low voltage level. As a result, the row address buffer unit 36a latches the row address signal, and the row address predecoded signals Xn are supplied to the row address decoder unit 36b. The bank address decoded signal BKB causes the row address decoder unit 36b to energize one of the word lines WLB1 to WLBm at time t73.

The input/output unit 38 has supplied a potential difference indicative of the new data bit to the sense amplifier unit 34b, and the new data bit is written into the memory cell with the row address indicated by the row address signal.

If the time period t41 is expired at time t74, the internal restore control signal IRSTR is changed to the low voltage level, and the NAND gate NA44 recovers the activation signal ACT1 to the inactive high voltage level. As a result, the row address buffer unit 36a cancels the row address signal, and the row address predecoded signals Xn and, accordingly, the selected word line are recovered to the low voltage level at time t75. Thereafter, the precharge/balance unit starts the equalization for the bit line pairs BLB1 to BLBn. In this instance, the restoring operation is carried out when the write-in operation is requested so as to minimize the time period tpR.

Third Embodiment

Yet another dynamic random access memory device embodying the present invention is similar to that of the second embodiment except for the internal control signal generating unit, and the components of the third embodiment are labeled with the same references as those of the first embodiment in the following description.

Figure 16:
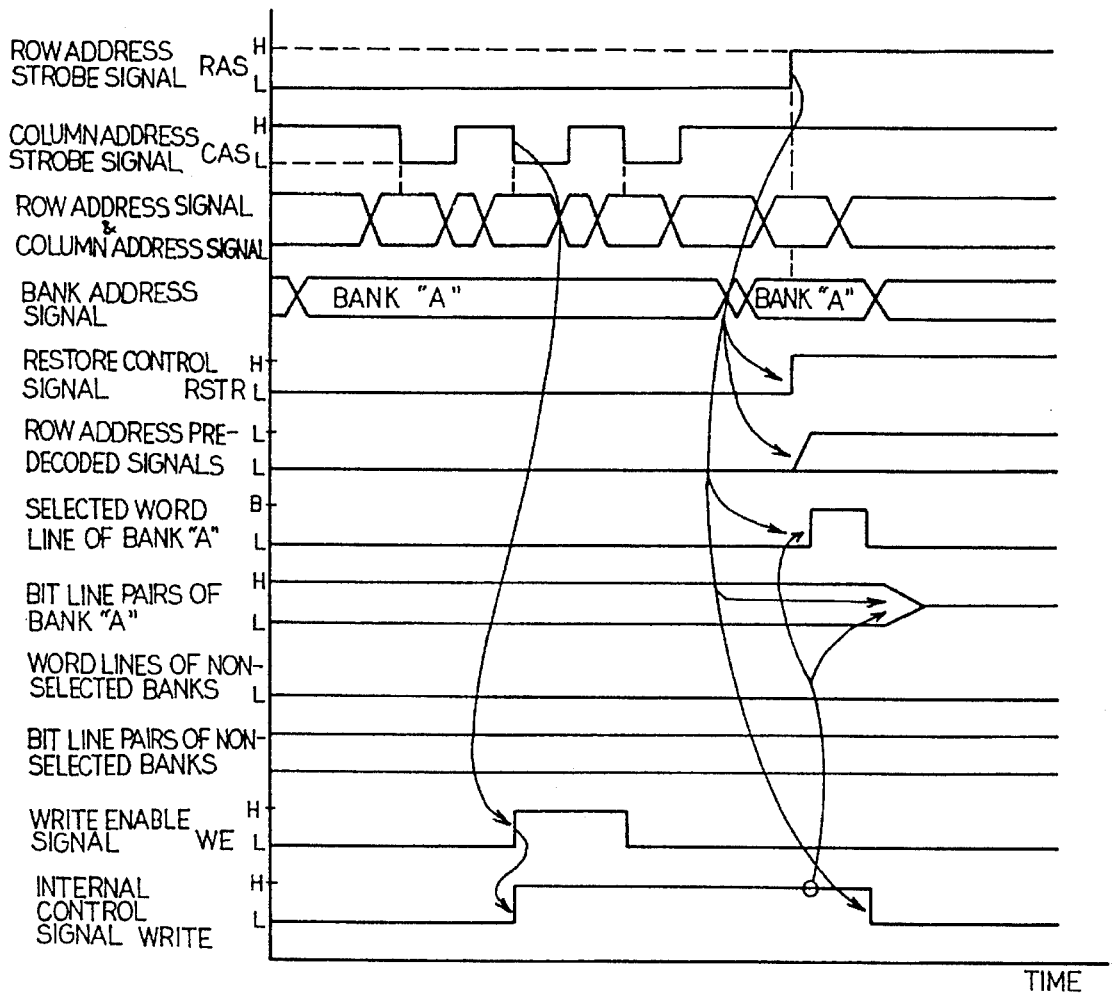
FIG. 16 is a timing chart showing a write-in sequence in a page access mode carried out by yet another dynamic random access memory device according to the present invention.

If a write request is received during a sequential access in the page mode, the dynamic random access memory device according to the present invention behaves as shown in FIG. 16. The write request is indicated by a write enable signal WE of the high voltage level, and the write enable signal WE causes an internal control signal WRITE to be set to the high voltage level indicative of the write request. The internal control signal WRITE is maintained in the high voltage level even if the write enable signal WE is recovered to the low voltage level, and is reset to the low voltage level when the row address strobe signal RAS is changed to the high voltage level.

Figure 17:
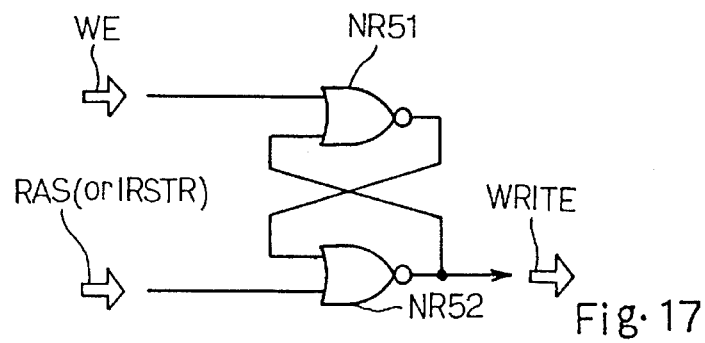
FIG. 17 is a logic diagram showing an internal control signal generating circuit incorporated in the yet another dynamic random access memory device according the present invention.

In order to produce the internal control signal WRITE, an internal control signal generating circuit shown in FIG. 17 is incorporated in the dynamic random access memory device. The internal control signal generating circuit is implemented by a flip flop circuit, and two NOR gates NR51 and NR52.

If the internal control signal WRITE is in the high voltage level at the leasing edge of the row address strobe signal RAS, one of the word lines specified by the row address is boosted over the positive power voltage level, and the associated sense amplifier circuits store data bits read out from the selected memory cells. When the word line is discharged, the bit line pairs associated with the memory cell array specified by the bank address signal are precharged.

Figure 18:
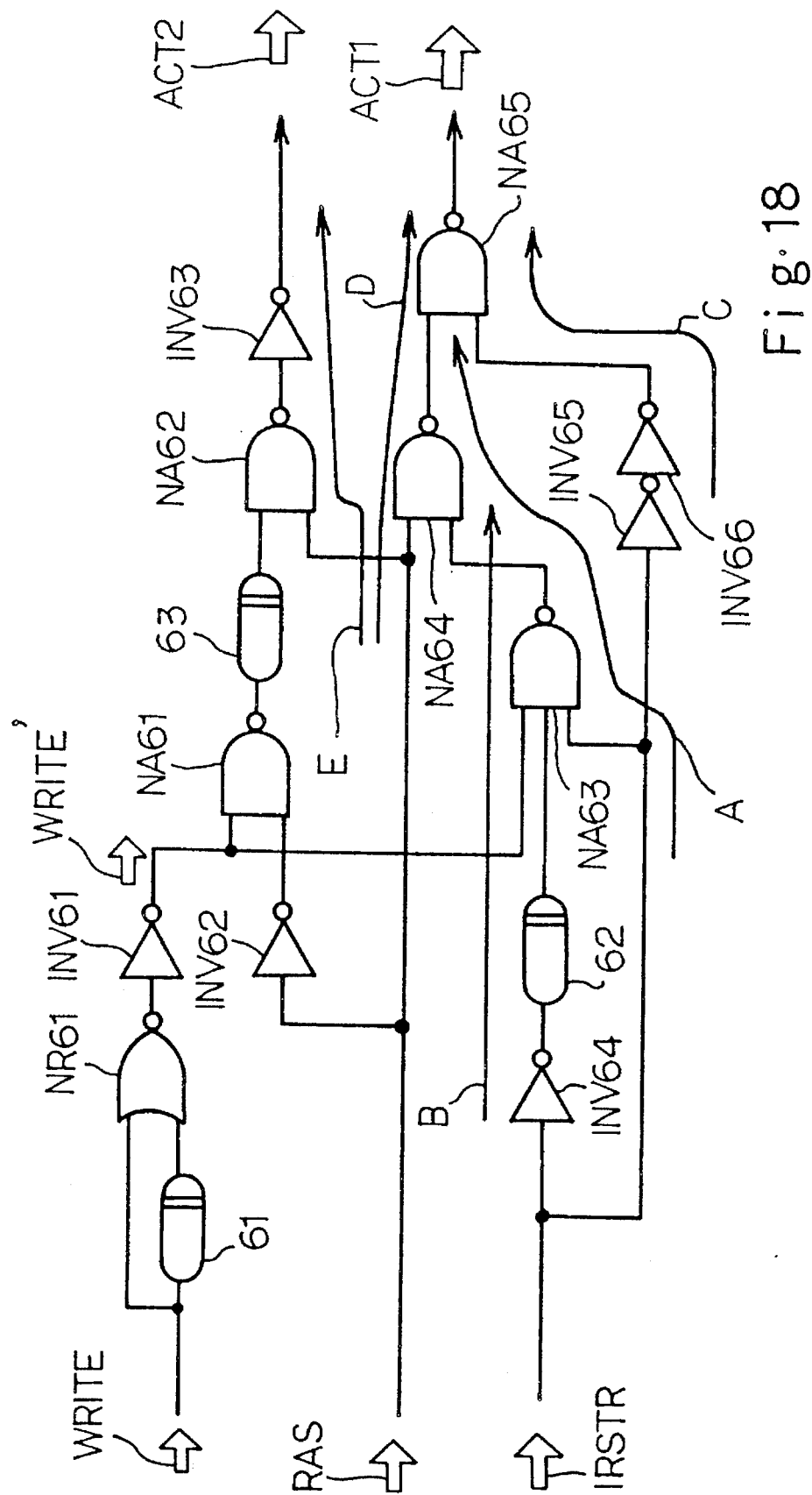
FIG. 18 is a logic diagram showing an internal control signal generating circuit incorporated in the yet another dynamic random access memory device.

Turning to FIG. 18 of the drawings, an internal control signal generating circuit for the activation signals ACT1 and ACT2 comprises three delay circuits 61, 62 and 63, a NOR gate NR61, inverters INV61, INV62, INV63, INV64, INV65 and INV66 and NAND gates NA61, NA62, NA63, NA64 and NA65, and produces the activation signals ACT1 and ACT2 from the row address strobe signal RAS, the internal restore control signal IRSTR and the internal control signal WRITE.

Figure 19:
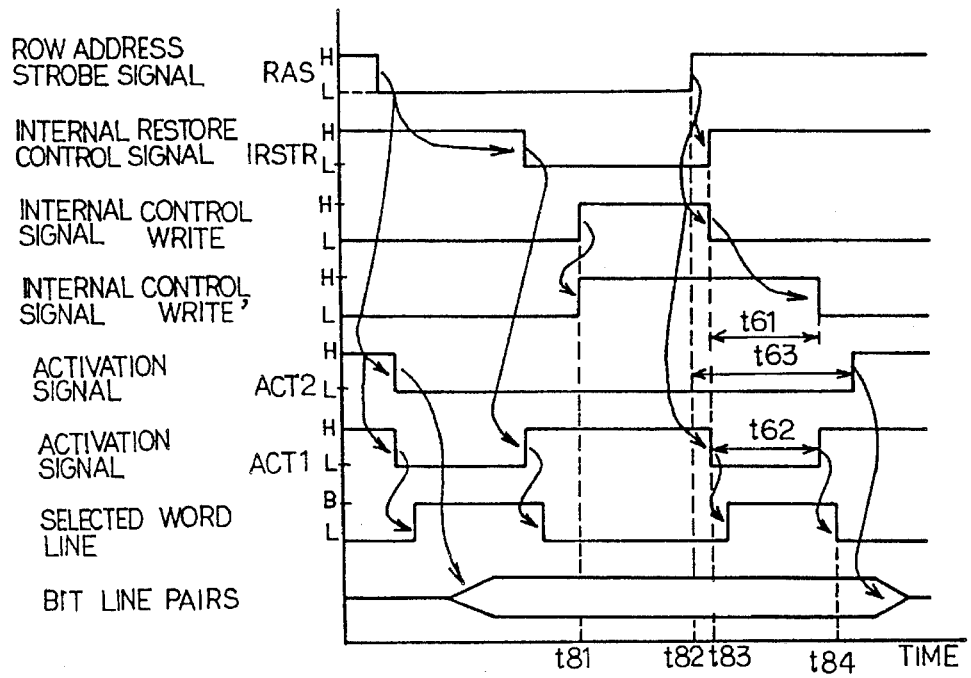
FIG. 19 is a timing chart showing a write-in sequence.

The dynamic random access memory device implementing the third embodiment behaves as follows. Assuming now that a write-in operation is requested through the write enable signal WE, the internal control signal generating circuit shown in FIG. 17 changes the internal control signal WRITE to the high voltage level at time t81 (see FIG. 19), and the internal control signals WRITE and WRITE' cause the delay circuits 61 and 63 to start the count-down of respective delay time periods.

If the row address strobe signal RAS is recovered to the high voltage level at time t82, the internal restore control signal IRSTR is changed to the high voltage level at time t83, and a signal path A (see FIG. 18) changes the activation signal ACT1 to the low voltage level.

When the delay time introduced by the delay circuit 62 is expired, the signal path B changes the activation signal ACT1 to the high voltage level. As a result, the selected word line is discharged at time t84. The delay time t62 is long enough to write a new data bit into one of the memory cells coupled to the selected word line. In order to keep the time period t62, the delay time t61 introduced by the delay circuit 61 should be longer than the delay time t62.

When the delay time t63 introduced by the delay circuit 63 is expired, the activation signal ACT2 is changed to the high voltage level, and the precharge/balance unit starts the equalization on the associated bit line pairs. For this reason, the delay time t63 is longer than the delay time t62.

Figure 20:
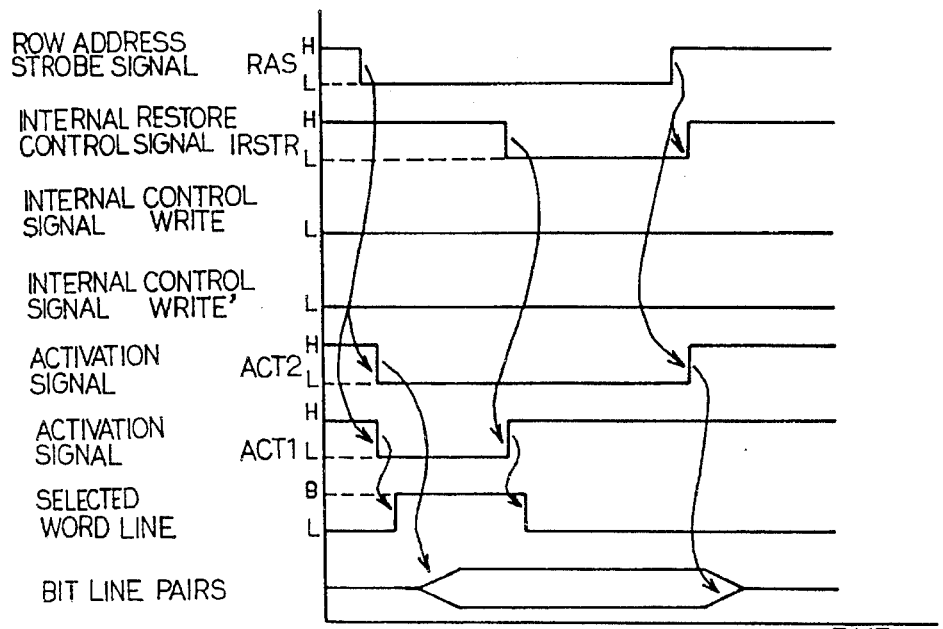
FIG. 20 is a timing chart showing a read-out sequence.

On the other hand, if there is not a write request, both internal control signals WRITE and WRITE' are maintained in the low voltage level as shown in FIG. 20, and the delay circuits 61 and 62 stand idle. The signal paths C and D keep the activation signal ACT1 in the high voltage level, and the row address strobe signal RAS controls the activation signal ACT2 through the signal path E.

As will be appreciated from the foregoing description, each of the row address decoder units is shared between two memory cell arrays, and the semiconductor chip is scaled down.

The activation signal ACT2 maintains the sense amplifier circuit active regardless of the control of word line, and the control of the word lines becomes simple.

Moreover, while the sense amplifier units store the data bits, the row address buffer unit can latch a new row address, and the access speed is improved.

Although particular embodiments of the present invention have been shown and described, it will be obvious to those skilled in the art that various changes and modifications may be made without departing from the spirit and scope of the present invention. For example, a dynamic random access memory device according to the present invention may have more than four memory cell arrays, and the present invention is applicable to a static type random access memory device having sense amplifiers respectively associated with digit line pairs. Moreover, the dynamic random access memory device according to the present invention may be split into more than one part respectively fabricated on semiconductor chips, and may form a part of a large scale integration together with other function blocks. Finally, the row address strobe signal RAS, the restore control signal RSTR and the row and column address signals may be produced by logic circuits integrated on a semiconductor chip together with the dynamic random access memory device according to the present invention.

What is claimed is:

1. A dynamic random access memory device capable of operating in a page mode, comprising:
   a) a plurality of memory cell arrays respectively assigned bank addresses, and each implemented by a plurality of memory cells each assigned a row address and a column address;
   b) a plurality of sets of word lines respectively associated with said plurality of memory cell arrays, and each having a plurality of word lines respectively coupled to rows of memory cells of the associated memory cell array for selectively making said rows of memory cells accessible;
   c) a plurality of sets of bit line pairs respectively associated with said plurality of memory cell arrays, and each having a plurality of bit line pairs respectively coupled to columns of memory cells for producing read-out potential differences indicative of data bits read out from one of said rows of memory cells;
   d) a bank addressing system responsive to an external bank address signal for selectively enabling said plurality of memory cell arrays;
   e) a row addressing system responsive to an external row address signal for selecting one of the word lines associated with the memory cell array enabled with said external bank address signal, and having
      e-1) a row address buffer unit responsive to a first internal control signal of an active level for storing the external row address signal indicative of the row address assigned to one of said rows of memory cells incorporated in each of said memory cell arrays, said row address buffer unit being operative to cancel said external row address signal in response to said first internal control signal of an inactive level, and
      e-2) a plurality of row address decoder units each shared between two of said plurality of memory cell arrays, and operative to energize one of the word lines coupled to the row of memory cells specified by said external row address signal and incorporated in the memory cell array enabled with said external bank address signal;
   f) a plurality of sets of sense amplifier circuits respectively associated with said plurality of sets of bit line pairs, each set of sense amplifier circuits being responsive to a second internal control signal of an active level for amplifying potential differences on the bit lines of the associated set for storing the potential differences on the bit lines of the associated set, said second internal control signal being independent of the change of said first internal control signal between said active level and said inactive level so that said row address buffer unit stores said external row address signal indicative of another row address without canceling potential differences stored in said each set of sense amplifier circuits;
   g) a column addressing system responsive to an external column address signal sequentially specifying the column addresses in said page mode for sequentially coupling bit line pairs of the set associated with said memory cell array specified with said external bank address signal to a data bus;
   h) an interface unit coupled to said data bus, and operative to produce an output data signal from one of the read-out potential differences on said data bus and to produce a potential difference on said data bus from an input data signal; and
   i) an internal control signal generating unit responsive to external control signals, and operative to produce a plurality of internal control signals including said first internal control signal and said second internal control signal for controlling said page mode.

2. The dynamic random access memory device as set forth in claim 1, in which said internal control signal generating unit has an internal control signal generating circuit for producing said first internal control signal from a first external control signal and a second external control signal, said internal control signal generating circuit being further operative to produce said second internal control signal from said first external control signal.

3. The dynamic random access memory device as set forth in claim 2, in which said first external control signal and said second external control signal are a row address strobe signal and a restore control signal.

4. The dynamic random access memory device as set forth in claim 2, in which said internal control signal generating circuit comprises a first series combination of logic gates responsive to a row address strobe signal for producing said second internal control signal and a second series combination of logic gates enabled with said row address strobe signal for producing said first internal control signal from a restore control signal.

5. The dynamic random access memory device as set forth in claim 4, in which said first series combination of logic gates is constituted by a first inverter supplied with said row address strobe signal, and a second inverter coupled to an output node of said first inverter for producing said second internal control signal, said second series combination of logic gates is constituted by said first inverter supplied with said row address strobe signal, a NAND gate having a first input node coupled to the output node of said first inverter and a second input node supplied with said restore control signal, a third inverter having an input node coupled to an output node of said NAND gate, and a fourth inverter having an input node coupled to an output node of said third inverter for producing said first internal control signal.

6. The dynamic random access memory device as set forth in claim 2, in which said internal control signal generating circuit changes said first internal control signal in response to said second external control signal in the presence of said first external control signal of said inactive level for storing the external row address signal, thereby allowing said row addressing system to select one of the word lines associated with the memory cell array specified by said bank address signal for writing a new data bit into one of the memory cells coupled to said one of said word lines.

7. The dynamic random access memory device as set forth in claim 1, in which said internal control signal generating unit has a first internal control signal generating circuit for producing an internal restore control signal from a row address strobe signal supplied from the outside of said dynamic random access memory device, and a second internal control signal generating circuit for producing said first internal control signal from said row address strobe signal and said internal restore control signal, said second internal control signal generating circuit being further operative to produce said second internal control signal from said row address strobe signal.

8. A dynamic random access memory device capable of operating in a page mode, comprising:

a) a plurality of memory cell arrays respectively assigned bank addresses, and each implemented by a plurality of memory cells each assigned a row address and a column address;

b) a plurality of sets of word lines respectively associated with said plurality of memory cell arrays, and each having a plurality of word lines respectively coupled to rows of memory cells of the associated memory cell array for selectively making said rows of memory cells accessible;

c) a plurality of sets of bit line pairs respectively associated with said plurality of memory cell arrays, and each having a plurality of bit line pairs respectively coupled to columns of memory cells for producing read-out potential differences indicative of data bits read out from one of said rows of memory cells;

d) a bank addressing system responsive to an external bank address signal for selectively enabling said plurality of memory cell arrays;

e) a row addressing system responsive to an external row address signal for selecting one of the word lines associated with the memory cell array enabled with said external bank address signal, and having e-1) a row address buffer unit responsive to a first internal control signal of an active level for storing the external row address signal indicative of the row address assigned to one of said rows of memory cells incorporated in each of said memory cell arrays, said row address buffer unit being operative to cancel said external row address signal in response to said first internal control signal of an inactive level, and e-2) a plurality of row address decoder units each shared between two of said plurality of memory cell arrays, and operative to energize one of the word lines coupled to the row of memory cells specified by said external row address signal and incorporated in the memory cell array enabled with said external bank address signal;

f) a plurality of sets of sense amplifier circuits respectively associated with said plurality of sets of bit line pairs, each set of sense amplifier circuits being responsive to a second internal control signal of an active level for amplifying potential differences on the bit lines of the associated set for storing the potential differences on the bit lines of the associated set, said second internal control signal being independent of the change of said first internal control signal between said active level and said inactive level so that said row address buffer unit stores said external row address signal indicative of another row address without canceling potential differences stored in said each set of sense amplifier circuits;

g) a column addressing system responsive to an external column address signal sequentially specifying the column addresses in said page mode for sequentially coupling bit line pairs of the set associated with said memory cell array specified with said external bank address signal to a data bus;

h) an interface unit coupled to said data bus, and operative to produce an output data signal from one of the read-out potential differences on said data bus and to produce a potential difference on said data bus from an input data signal; and i) an internal control signal generating unit responsive to external control signals, and operative to produce a plurality of internal control signals including said first internal control signal and said second internal control signal for controlling said page mode, said internal control signal generating unit having:

a first internal control signal generating circuit for producing an internal restore control signal from a row address strobe signal supplied from the outside of said dynamic random access memory device; and a second internal control signal generating circuit for producing said first internal control signal from said row address strobe signal and said internal restore control signal, said second internal control signal generating circuit being further operative to produce said second internal control signal from said row address strobe signal, wherein said first internal control signal generating circuit comprises:

a delay circuit supplied with said row address strobe signal for producing a first delayed row address strobe signal, a delay time introduced by said delay circuit allowing one of said word lines to remain in the active level for writing a write-in data bit into one of the memory cells coupled to said one of said word lines, a NOR gate supplied with said row address strobe signal and said first delayed row address strobe signal, and a first inverter having an input node coupled to an output node of said NOR gate for producing said internal restore control signal, and wherein said second internal control signal generating circuit comprises:

a second delay circuit for producing a second delayed row address strobe signal, a first NAND gate supplied with said row address strobe signal and said second delayed row address strobe signal, a second inverter having an input node coupled to an output node of said first NAND gate for producing said second internal control signal, a third delay circuit for producing a delayed internal restore control signal from said internal restore control signal, a third inverter supplied with said delayed internal restore control signal, a second NAND gate having a first input node coupled to an output node of said third inverter and a second input node supplied with said internal restore control signal, a third NAND gate having a first input node supplied with said row address strobe signal and a second input node coupled to an output node of said second NAND gate, and a fourth NAND gate having a first input node supplied with said internal restore control signal and a second input node coupled to an output node of said third NAND gate for producing said first internal control signal.

9. A dynamic random access memory device capable of operating in a page mode, comprising:

a) a plurality of memory cell arrays respectively assigned bank addresses, and each implemented by a plurality of memory cells each assigned a row address and a column address;

b) a plurality of sets of word lines respectively associated with said plurality of memory cell arrays, and each having a plurality of word lines respectively coupled to rows of memory cells of the associated memory cell array for selectively making said rows of memory cells accessible;

c) a plurality of sets of bit line pairs respectively associated with said plurality of memory cell arrays, and each having a plurality of bit line pairs respectively coupled to columns of memory cells for producing read-out potential differences indicative of data bits read out from one of said rows of memory cells;

d) a bank addressing system responsive to an external bank address signal for selectively enabling said plurality of memory cell arrays;

e) a row addressing system responsive to an external row address signal for selecting one of the word lines associated with the memory cell array enabled with said external bank address signal, and having e-1) a row address buffer unit responsive to a first internal control signal of an active level for storing the external row address signal indicative of the row address assigned to one of said rows of memory cells incorporated in each of said memory cell arrays, said row address buffer unit being operative to cancel said external row address signal in response to said first internal control signal of an inactive level, and e-2) a plurality of row address decoder units each shared between two of said plurality of memory cell arrays, and operative to energize one of the word lines coupled to the row of memory cells specified by said external row address signal and incorporated in the memory cell array enabled with said external bank address signal;

f) a plurality of sets of sense amplifier circuits respectively associated with said plurality of sets of bit line pairs, each set of sense amplifier circuits being responsive to a second internal control signal of an active level for amplifying potential differences on the bit lines of the associated set for storing the potential differences on the bit lines of the associated set, said second internal control signal being independent of the change of said first internal control signal between said active level and said inactive level so that said row address buffer unit stores said external row address signal indicative of another row address without canceling potential differences stored in said each set of sense amplifier circuits;

g) a column addressing system responsive to an external column address signal sequentially specifying the column addresses in said page mode for sequentially coupling bit line pairs of the set associated with said memory cell array specified with said external bank address signal to a data bus;

h) an interface unit coupled to said data bus, and operative to produce an output data signal from one of the read-out potential differences on said data bus and to produce a potential difference on said data bus from an input data signal; and i) an internal control signal generating unit responsive to external control signals, and operative to produce a plurality of internal control signals including said first internal control signal and said second internal control signal for controlling said page mode, said internal control signal generating unit comprising:

a first internal control signal generating circuit for producing an internal restore control signal from a row address strobe signal supplied from the outside of said dynamic random access memory device, a second internal control signal generating circuit responsive to a write enable signal supplied from the outside of said dynamic random access memory device for changing a third internal control signal to an active level, said second internal control signal generating circuit changing said third internal control signal to an inactive level in response to one of a row address strobe signal and said internal restore control signal, and a third internal control signal generating circuit responsive to said third internal control signal, said row address strobe signal and said internal restore control signal for producing said first internal control signal and said second internal control signal.

10. The dynamic random access memory device as set forth in claim 9, in which said first internal control signal generating circuit comprises:

a first delay circuit for producing a first delayed row address strobe signal from said row address strobe signal, a first NOR gate supplied with said row address strobe signal and said first delayed row address strobe signal, and a first inverter having an input node coupled to an output node of said first NOR gate for producing said internal restore control signal, said second internal control signal generating circuit being implemented by a flip flop circuit having a first input node applied with said write enable signal and a second input node supplied with said one of said row address strobe signal and said internal restore control signal, said third internal control signal generating circuit comprising:
- a second delay circuit for producing a delayed third internal control signal from said third internal control signal,
- a second NOR gate supplied with said third internal control signal and said delayed third internal control signal,
- a second inverter having an input node coupled to an output node of said second NOR gate,
- a third inverter supplied with said row address strobe signal,
- a first NAND gate having a first input node coupled to an output node of said second inverter and a second input node coupled to an output node of said third inverter,
- a third delay circuit having a input node coupled to an output node of said first NAND gate,
- a second NAND gate having a first input node coupled to an output node of said third delay circuit and a second input node supplied with said row address strobe signal,
- a fourth inverter having an input node coupled to an output node of said second NAND gate for producing said second internal control signal,
- a fifth inverter supplied with said internal restore control signal,
- a fourth delay circuit having an input node coupled to an output node of said fifth inverter,
- a third NAND gate having a first input node coupled to an output node of said fourth delay circuit and a second input node supplied with said internal restore control signal,
- a fourth NAND gate having a first input node supplied with said row address strobe signal and a second input node coupled to an output node of said third NAND gate,
- sixth inverters coupled in series and supplied with said internal restore control signal, and
- a fifth NAND gate having a first input node coupled to an output node of said fourth NAND gate and a second input node coupled to art output node of the sixth inverters for producing said first internal control signal.

* * * * *